(12) United States Patent
Chung

(10) Patent No.: US 9,183,897 B2
(45) Date of Patent: Nov. 10, 2015

(54) CIRCUITS AND METHODS OF A SELF-TIMED HIGH SPEED SRAM

(71) Applicant: Shine C. Chung, San Jose, CA (US)

(72) Inventor: Shine C. Chung, San Jose, CA (US)

( * ) Notice: Subject to any disclaimer, the term of this patent is extended or adjusted under 35 U.S.C. 154(b) by 0 days.

(21) Appl. No.: 14/042,392

(22) Filed: Sep. 30, 2013

(65) Prior Publication Data

US 2014/0092674 A1    Apr. 3, 2014

Related U.S. Application Data

(60) Provisional application No. 61/708,040, filed on Sep. 30, 2012.

(51) Int. Cl.
| | |
|---|---|
| *G11C 7/06* | (2006.01) |
| *G11C 7/22* | (2006.01) |
| *G11C 11/419* | (2006.01) |
| *G11C 11/418* | (2006.01) |

(52) U.S. Cl.
CPC ............... *G11C 7/065* (2013.01); *G11C 7/227* (2013.01); *G11C 11/419* (2013.01); *G11C 11/418* (2013.01)

(58) Field of Classification Search
CPC ............ G11C 7/06; G11C 7/14; G11C 7/227; G11C 16/28
USPC .............................. 365/154, 205, 207, 210.1
See application file for complete search history.

(56) References Cited

U.S. PATENT DOCUMENTS

| | | |
|---|---|---|
| 3,198,670 A | 8/1965 | Nissim |
| 3,715,242 A | 2/1973 | Daniel |
| 4,148,046 A | 4/1979 | Hendrickson et al. |
| 4,192,059 A | 3/1980 | Khan et al. |
| 4,642,674 A | 2/1987 | Schoofs |
| 5,192,989 A | 3/1993 | Matsushita et al. |
| 5,389,552 A | 2/1995 | Iranmanesh |
| 5,447,876 A | 9/1995 | Moyer et al. |
| 5,635,742 A | 6/1997 | Hoshi et al. |
| 5,637,901 A | 6/1997 | Beigel et al. |
| 5,723,890 A | 3/1998 | Fujihira et al. |

(Continued)

FOREIGN PATENT DOCUMENTS

| | | |
|---|---|---|
| CN | 1469473 A | 1/2004 |
| CN | 1691204 A | 11/2005 |

(Continued)

OTHER PUBLICATIONS

Notice of Allowance for U.S. Appl. No. 13/590,444, mailed May 12, 2015.

(Continued)

*Primary Examiner* — Hoai V Ho
*Assistant Examiner* — Tri Hoang

(57) ABSTRACT

Circuits and methods for precisely self-timed SRAM memory are disclosed to track the wordline and/or bitline/bitline bar (BL/BLB) propagation delays. At least one reference cell can be placed near the far end of a driver to drive a selected wordline or a reference wordline. When a wordline and/or a reference wordline is turned on, the reference cell can be selected not earlier than any selected SRAM cells and can activate a reference bitline (RBL) not later than any selected SRAM cells activating the BL or BLB. The activation of the RBL can be used to trigger at least one sense amplifier. The RBL can also be used to de-select wordline or reference wordline after the sense amplifier operation is complete to save power.

20 Claims, 10 Drawing Sheets

(56) References Cited

U.S. PATENT DOCUMENTS

| | | |
|---|---|---|
| 5,757,046 A | 5/1998 | Fujihira et al. |
| 5,761,148 A | 6/1998 | Allan et al. |
| 5,962,903 A | 10/1999 | Sung et al. |
| 6,002,156 A | 12/1999 | Lin |
| 6,008,092 A | 12/1999 | Gould |
| 6,034,882 A | 3/2000 | Johnson et al. |
| 6,054,344 A | 4/2000 | Liang et al. |
| 6,140,687 A | 10/2000 | Shimormura et al. |
| 6,243,864 B1 | 6/2001 | Odani et al. |
| 6,249,472 B1 | 6/2001 | Tamura et al. |
| 6,346,727 B1 | 2/2002 | Ohtomo |
| 6,388,292 B1 | 5/2002 | Lin |
| 6,400,540 B1 | 6/2002 | Chang |
| 6,405,160 B1 | 6/2002 | Djaja et al. |
| 6,461,934 B2 | 10/2002 | Nishida et al. |
| 6,483,734 B1 | 11/2002 | Sharma et al. |
| 6,597,629 B1 * | 7/2003 | Raszka et al. .......... 365/233.1 |
| 6,611,043 B2 | 8/2003 | Takiguchi |
| 6,731,535 B1 | 5/2004 | Ooishi et al. |
| 6,770,953 B2 | 8/2004 | Boeck et al. |
| 6,803,804 B2 | 10/2004 | Madurawe |
| 6,813,705 B2 | 11/2004 | Duesterwald et al. |
| 6,944,083 B2 | 9/2005 | Pedlow |
| 6,967,879 B2 | 11/2005 | Mizukoshi |
| 7,009,182 B2 | 3/2006 | Kannan et al. |
| 7,211,843 B2 | 5/2007 | Low et al. |
| 7,212,432 B2 | 5/2007 | Ferrant et al. |
| 7,224,598 B2 | 5/2007 | Perner |
| 7,263,027 B2 | 8/2007 | Kim et al. |
| 7,294,542 B2 | 11/2007 | Okushima |
| 7,391,064 B1 | 6/2008 | Tripsas et al. |
| 7,411,844 B2 | 8/2008 | Nitzan et al. |
| 7,439,608 B2 | 10/2008 | Arendt |
| 7,461,371 B2 | 12/2008 | Luo et al. |
| 7,573,762 B2 | 8/2009 | Kenkare et al. |
| 7,589,367 B2 | 9/2009 | Oh et al. |
| 7,660,181 B2 | 2/2010 | Kumar et al. |
| 7,696,017 B1 | 4/2010 | Tripsas et al. |
| 7,701,038 B2 | 4/2010 | Chen et al. |
| 7,764,532 B2 | 7/2010 | Kurjanowicz et al. |
| 7,802,057 B2 | 9/2010 | Iyer et al. |
| 7,808,815 B2 | 10/2010 | Ro et al. |
| 7,830,697 B2 | 11/2010 | Herner |
| 7,833,823 B2 | 11/2010 | Klersy |
| 7,859,920 B2 * | 12/2010 | Jung et al. ............. 365/189.15 |
| 7,889,204 B2 | 2/2011 | Hansen et al. |
| 7,910,999 B2 | 3/2011 | Lee et al. |
| 8,008,723 B2 | 8/2011 | Nagai |
| 8,050,129 B2 | 11/2011 | Liu et al. |
| 8,089,137 B2 | 1/2012 | Lung et al. |
| 8,115,280 B2 | 2/2012 | Chen et al. |
| 8,119,048 B2 | 2/2012 | Nishimura |
| 8,168,538 B2 | 5/2012 | Chen et al. |
| 8,174,063 B2 | 5/2012 | Liu et al. |
| 8,174,922 B2 | 5/2012 | Naritake |
| 8,179,711 B2 | 5/2012 | Kim et al. |
| 8,183,665 B2 | 5/2012 | Bertin et al. |
| 8,217,490 B2 | 7/2012 | Bertin et al. |
| 8,233,316 B2 | 7/2012 | Liu et al. |
| 8,339,079 B2 | 12/2012 | Tamada |
| 8,369,166 B2 | 2/2013 | Kurjanowicz et al. |
| 8,373,254 B2 | 2/2013 | Chen et al. |
| 8,380,768 B2 | 2/2013 | Hoefler |
| 8,415,764 B2 | 4/2013 | Chung |
| 8,482,972 B2 | 7/2013 | Chung |
| 8,488,359 B2 | 7/2013 | Chung |
| 8,488,364 B2 | 7/2013 | Chung |
| 8,514,606 B2 | 8/2013 | Chung |
| 8,526,254 B2 | 9/2013 | Kurjanowicz et al. |
| 8,559,208 B2 | 10/2013 | Chung |
| 8,570,800 B2 | 10/2013 | Chung |
| 8,576,602 B2 | 11/2013 | Chung |
| 8,643,085 B2 | 2/2014 | Pfirsch |
| 8,644,049 B2 | 2/2014 | Chung |
| 8,648,349 B2 | 2/2014 | Masuda et al. |
| 8,649,203 B2 | 2/2014 | Chung |
| 8,699,259 B2 | 4/2014 | Zhang et al. |
| 8,760,904 B2 | 6/2014 | Chung |
| 8,817,563 B2 | 8/2014 | Chung |
| 8,830,720 B2 | 9/2014 | Chung |
| 8,854,859 B2 | 10/2014 | Chung |
| 8,861,249 B2 | 10/2014 | Chung |
| 8,913,415 B2 | 12/2014 | Chung |
| 8,913,449 B2 | 12/2014 | Chung |
| 8,923,085 B2 | 12/2014 | Chung |
| 8,988,965 B2 | 3/2015 | Chung |
| 9,019,742 B2 | 4/2015 | Chung |
| 9,019,791 B2 | 4/2015 | Chung |
| 9,025,357 B2 | 5/2015 | Chung |
| 2002/0168821 A1 | 11/2002 | Williams et al. |
| 2002/0196659 A1 | 12/2002 | Hurst et al. |
| 2003/0104860 A1 | 6/2003 | Cannon et al. |
| 2003/0135709 A1 | 7/2003 | Niles et al. |
| 2003/0169625 A1 | 9/2003 | Hush et al. |
| 2004/0057271 A1 | 3/2004 | Parkinson |
| 2004/0113183 A1 | 6/2004 | Karpov et al. |
| 2004/0130924 A1 | 7/2004 | Ma et al. |
| 2005/0060500 A1 | 3/2005 | Luo et al. |
| 2005/0062110 A1 | 3/2005 | Dietz et al. |
| 2005/0110081 A1 | 5/2005 | Pendharkar |
| 2005/0124116 A1 | 6/2005 | Hsu et al. |
| 2005/0146962 A1 | 7/2005 | Schreck |
| 2005/0242386 A1 | 11/2005 | Ang |
| 2006/0072357 A1 | 4/2006 | Wicker |
| 2006/0092689 A1 | 5/2006 | Braun et al. |
| 2006/0104111 A1 | 5/2006 | Tripsas et al. |
| 2006/0120148 A1 | 6/2006 | Kim et al. |
| 2006/0129782 A1 | 6/2006 | Bansal et al. |
| 2006/0215440 A1 | 9/2006 | Cho et al. |
| 2006/0244099 A1 | 11/2006 | Kurjanowicz |
| 2007/0004160 A1 | 1/2007 | Voldman |
| 2007/0057323 A1 | 3/2007 | Furukawa et al. |
| 2007/0081377 A1 | 4/2007 | Zheng et al. |
| 2007/0133341 A1 | 6/2007 | Lee et al. |
| 2007/0138549 A1 | 6/2007 | Wu et al. |
| 2007/0223266 A1 | 9/2007 | Chen |
| 2007/0279978 A1 | 12/2007 | Ho et al. |
| 2008/0025068 A1 | 1/2008 | Scheuerlein et al. |
| 2008/0028134 A1 | 1/2008 | Matsubara et al. |
| 2008/0044959 A1 | 2/2008 | Cheng et al. |
| 2008/0067601 A1 | 3/2008 | Chen |
| 2008/0105878 A1 | 5/2008 | Ohara |
| 2008/0151612 A1 | 6/2008 | Pellizzer et al. |
| 2008/0170429 A1 | 7/2008 | Bertin et al. |
| 2008/0175060 A1 | 7/2008 | Zonghsan Lie et al. |
| 2008/0220560 A1 | 9/2008 | Klersy |
| 2008/0225567 A1 | 9/2008 | Burr et al. |
| 2008/0280401 A1 | 11/2008 | Burr et al. |
| 2009/0055617 A1 | 2/2009 | Bansal et al. |
| 2009/0168493 A1 | 7/2009 | Kim et al. |
| 2009/0172315 A1 | 7/2009 | Iyer et al. |
| 2009/0180310 A1 | 7/2009 | Shimomura et al. |
| 2009/0194839 A1 | 8/2009 | Bertin et al. |
| 2009/0213660 A1 | 8/2009 | Pikhay et al. |
| 2009/0219756 A1 | 9/2009 | Schroegmeier et al. |
| 2009/0309089 A1 | 12/2009 | Hsia et al. |
| 2010/0027326 A1 | 2/2010 | Kim et al. |
| 2010/0085798 A1 | 4/2010 | Lu et al. |
| 2010/0091546 A1 | 4/2010 | Liu et al. |
| 2010/0142254 A1 | 6/2010 | Choi et al. |
| 2010/0157651 A1 | 6/2010 | Kumar et al. |
| 2010/0171086 A1 | 7/2010 | Lung et al. |
| 2010/0232203 A1 | 9/2010 | Chung et al. |
| 2010/0238701 A1 | 9/2010 | Tsukamoto et al. |
| 2010/0246237 A1 | 9/2010 | Borot et al. |
| 2010/0277967 A1 | 11/2010 | Lee et al. |
| 2010/0301304 A1 | 12/2010 | Chen et al. |
| 2011/0022648 A1 | 1/2011 | Harris et al. |
| 2011/0062557 A1 | 3/2011 | Bandyopadhyay et al. |
| 2011/0128772 A1 | 6/2011 | Kim et al. |
| 2011/0145777 A1 | 6/2011 | Iyer et al. |
| 2011/0175199 A1 | 7/2011 | Lin et al. |
| 2011/0222330 A1 | 9/2011 | Lee et al. |
| 2011/0260289 A1 | 10/2011 | Oyamada |

(56) References Cited

U.S. PATENT DOCUMENTS

| | | |
|---|---|---|
| 2011/0297912 A1 | 12/2011 | Samachisa et al. |
| 2011/0310655 A1 | 12/2011 | Kreupl et al. |
| 2011/0312166 A1 | 12/2011 | Yedinak et al. |
| 2012/0032303 A1 | 2/2012 | Elkareh et al. |
| 2012/0039107 A1 | 2/2012 | Chung |
| 2012/0044736 A1 | 2/2012 | Chung |
| 2012/0044737 A1 | 2/2012 | Chung |
| 2012/0044738 A1 | 2/2012 | Chung |
| 2012/0044739 A1 | 2/2012 | Chung |
| 2012/0044740 A1 | 2/2012 | Chung |
| 2012/0044743 A1 | 2/2012 | Chung |
| 2012/0044744 A1 | 2/2012 | Chung |
| 2012/0044745 A1 | 2/2012 | Chung |
| 2012/0044746 A1 | 2/2012 | Chung |
| 2012/0044747 A1 | 2/2012 | Chung |
| 2012/0044748 A1 | 2/2012 | Chung |
| 2012/0044753 A1 | 2/2012 | Chung |
| 2012/0044756 A1 | 2/2012 | Chung |
| 2012/0044757 A1 | 2/2012 | Chung |
| 2012/0044758 A1 | 2/2012 | Chung |
| 2012/0047322 A1 | 2/2012 | Chung |
| 2012/0074460 A1 | 3/2012 | Kitagawa |
| 2012/0106231 A1 | 5/2012 | Chung |
| 2012/0147653 A1 | 6/2012 | Chung |
| 2012/0147657 A1 | 6/2012 | Sekar et al. |
| 2012/0209888 A1 | 8/2012 | Chung |
| 2012/0224406 A1 | 9/2012 | Chung |
| 2012/0256292 A1 | 10/2012 | Yu et al. |
| 2012/0287730 A1 | 11/2012 | Kim |
| 2012/0314472 A1 | 12/2012 | Chung |
| 2012/0314473 A1 | 12/2012 | Chung |
| 2012/0320656 A1 | 12/2012 | Chung |
| 2012/0320657 A1 | 12/2012 | Chung |
| 2013/0148409 A1 | 6/2013 | Chung |
| 2013/0161780 A1 | 6/2013 | Kizilyalli et al. |
| 2013/0189829 A1 | 7/2013 | Mieczkowski et al. |
| 2013/0200488 A1 | 8/2013 | Chung |
| 2013/0201745 A1 | 8/2013 | Chung |
| 2013/0201746 A1 | 8/2013 | Chung |
| 2013/0201748 A1 | 8/2013 | Chung |
| 2013/0201749 A1 | 8/2013 | Chung |
| 2013/0208526 A1 | 8/2013 | Chung |
| 2013/0215663 A1 | 8/2013 | Chung |
| 2013/0235644 A1 | 9/2013 | Chung |
| 2013/0268526 A1 | 10/2013 | John et al. |
| 2013/0308366 A1 | 11/2013 | Chung |
| 2014/0010032 A1* | 1/2014 | Seshadri et al. ............ 365/203 |
| 2014/0016394 A1 | 1/2014 | Chung et al. |
| 2014/0071726 A1 | 3/2014 | Chung |
| 2014/0092674 A1 | 4/2014 | Chung |
| 2014/0124871 A1 | 5/2014 | Ko et al. |
| 2014/0124895 A1 | 5/2014 | Salzman et al. |
| 2014/0126266 A1 | 5/2014 | Chung |
| 2014/0131710 A1 | 5/2014 | Chung |
| 2014/0131711 A1 | 5/2014 | Chung |
| 2014/0131764 A1 | 5/2014 | Chung |
| 2014/0133056 A1 | 5/2014 | Chung |
| 2014/0160830 A1 | 6/2014 | Chung |
| 2014/0211567 A1 | 7/2014 | Chung |
| 2014/0269135 A1 | 9/2014 | Chung |
| 2014/0340954 A1 | 11/2014 | Chung |
| 2015/0003142 A1 | 1/2015 | Chung |
| 2015/0009743 A1 | 1/2015 | Chung |
| 2015/0014785 A1 | 1/2015 | Chung |
| 2015/0021543 A1 | 1/2015 | Chung |
| 2015/0029777 A1 | 1/2015 | Chung |
| 2015/0078060 A1 | 3/2015 | Chung |

FOREIGN PATENT DOCUMENTS

| | | |
|---|---|---|
| CN | 101083227 A | 5/2007 |
| CN | 101057330 A | 10/2007 |
| CN | 101188140 A | 5/2008 |
| CN | 101271881 A | 9/2008 |
| CN | 101483062 A | 7/2009 |
| CN | 101728412 A | 6/2010 |
| EP | 1367596 A1 | 12/2003 |
| JP | 03-264814 | 11/1991 |
| TW | I309081 | 4/2009 |

OTHER PUBLICATIONS

Notice of Allowance for U.S. Appl. No. 13/072,783, mailed May 13, 2015.

Notice of Allowance for U.S. Appl. No. 13/833,067, mailed Jun. 5, 2015.

Office Action for U.S. Appl. No. 13/314,444, mailed Dec. 10, 2014.

U.S. Appl. No. 13/471,704, filed May 15, 2012.
U.S. Appl. No. 13/026,650, filed Feb. 14, 2011.
U.S. Appl. No. 13/026,656, filed Feb. 14, 2011.
U.S. Appl. No. 13/026,664, filed Feb. 14, 2011.
U.S. Appl. No. 13/026,678, filed Feb. 14, 2011.
U.S. Appl. No. 13/026,692, filed Feb. 14, 2011.
U.S. Appl. No. 13/026,704, filed Feb. 14, 2011.
U.S. Appl. No. 13/026,717, filed Feb. 14, 2011.
U.S. Appl. No. 13/026,725, filed Feb. 14, 2011.
U.S. Appl. No. 13/026,752, filed Feb. 14, 2011.
U.S. Appl. No. 13/026,771, filed Feb. 14, 2011.
U.S. Appl. No. 13/026,783, filed Feb. 14, 2011.
U.S. Appl. No. 13/026,835, filed Feb. 14, 2011.
U.S. Appl. No. 13/026,840, filed Feb. 14, 2011.
U.S. Appl. No. 13/026,852, filed Feb. 14, 2011.
U.S. Appl. No. 13/214,198, filed Aug. 21, 2011.
U.S. Appl. No. 13/590,044, filed Aug. 20, 2012.
U.S. Appl. No. 13/590,047, filed Aug. 20, 2012.
U.S. Appl. No. 13/590,049, filed Aug. 20, 2012.
U.S. Appl. No. 13/590,050, filed Aug. 20, 2012.
U.S. Appl. No. 13/214,183, filed Aug. 20, 2011.
U.S. Appl. No. 13/288,843, filed Nov. 3, 2011.
U.S. Appl. No. 13/314,444, filed Dec. 8, 2011.
U.S. Appl. No. 13/397,673, filed Feb. 15, 2012.
U.S. Appl. No. 13/571,797, filed Aug. 10, 2012.
U.S. Appl. No. 13/678,539, filed Nov. 15, 2012.
U.S. Appl. No. 13/678,544, filed Nov. 15, 2012.
U.S. Appl. No. 13/678,541, filed Nov. 15, 2012.
U.S. Appl. No. 13/678,543, filed Nov. 15, 2012.

Ahn, S.J. et al, "Highly Reliable 50nm Contact Cell Technology for 256Mb PRAM," IEEE VLSI Tech Symp., Jun. 2005, pp. 98-99.

Alavi, Mohsen, et al., "A PROM Element Based on Salicide Allgomeration of Poly Fuses in a CMOS Logic Process," IEEE IEDM, 97, pp. 855-858.

Andre, T. W. et al., "A 4-Mb 0.18um 1T1MTJ Toggle MRAM With Balanced Three Input Sensing Scheme and Locally Mirrored Unidirectional Write Drivers," IEEE J. of Solid-State Circuits, vol. 40, No. 1, Jan. 2005, pp. 301-309.

Ang, Boon et al., "NiSi Polysilicon Fuse Reliability in 65nm Logic CMOS Technology," IEEE Trans. on Dev. Mat. Rel. vol. 7, No. 2, Jun. 2007, pp. 298-303.

Aziz, A. et al., Lateral Polysilicon n+p Diodes: Effect of the Grain boundaries and of the p-Implemented Doping Level on the I-V and C-V Characteristics, "Springer Proceedings in Physics", vol. 54, 1991, pp. 318-322.

Aziz, A. et al., "Lateral Polysilicon PN Diodes: Current-Voltage Characteristics Simulation Between 200K and 400K a Numerical Approach," IEEE Trans. on Elec. Dev., vol. 41, No. 2, Feb. 1994, pp. 204-211.

Banerjee, Kaustav et al., "High Current Effects in Silicide Films for Sub-0.25um VLSI Technologies," IEEE 36th IRPS, 1998, pp. 284-292.

Bedeschi, F. et al., "4-Mb MOSFET-Selected uTrench Phase-Change Memory Experimental Chip," IEEE J. of Solid-State Circuits, vol. 40, No. 7, Jul. 2005, pp. 1557-1565.

Bedeschi, F. et al., "A Bipolar-Selected Phase Change Memory Featuring Multi-Level Cell Storage," IEEE J. Sol. Stat. Cir., vol. 44, No. 1, Jan. 2009, pp. 217-227.

(56) References Cited

OTHER PUBLICATIONS

Bedeschi, F. et al., "A Fully Symmetrical Sense Amplifier for Non-volatile Memories," IEEE. Int. Symp. on Circuits and Systems, (ISCAS), vol. 2, 2004, pp. 625-628.
Bedeschi, F. et al., "An 8Mb Demonstrator for High-Density 1.8V Phase-Change Memories," VLIS Cir. Symp, Jun. 2004, pp. 442-445.
Bedeschi, F. et al., "SET and RESET Pulse Characterization in BJT-Selected Phase-Change Memory," IEEE Int. Symp. on Circuits and Systems (ISCAS), 2005, pp. 1270-1273.
Braganca, P. M. et al., "A Three-Terminal Approach to Developing Spin-Torque Written Magnetic Random Access Memory Cells," IEEE Trans. on Nano. vol. 8, No. 2, Mar. 2009, pp. 190-195.
Cagli, C. et al., "Evidence for threshold switching in the set process of NiO-based RRAM and physical modeling for set, reset, retention and disturb prediction," IEEE IEDM, 2008, pp. 1-4.
Chan, W. T. et al., "CMOS Compatible Zero-Mask One-Time Programmable (OTP) Memory Design," Proc. Int. Conf. Solid State Integr. Cir. Tech., Beijing, China, Oct. 20-23, 2008, pp. 861-864.
Chan, Wan Tim, et al., "CMOS Compatible Zero-Mask One Time Programmable Memory Design", Master Thesis, Hong-Kong University of Science and Technologies, 2008.
Chang, Meng-Fan et al., "Circuit Design Challenges in Embedded Memory and Resistive RAM (RRAM) for Mobile SoC and 3D-IC", Design Automation Conference (ASP-DAC), 16th Asia and South Pacific, 2011, pp. 197-203.
Cheng, Yu-Hsing et al., "Failure Analysis and Optimization of Metal Fuses for Post Package Trimming," IEEE 45th IRPS, 2007, pp. 616-617.
Chiu, Pi-Feng et al., "A Low Store Energy, Low VDDmin, Nonvolatile 8T2R SRAM with 3D Stacked RRAM Devices for Low Power Mobile Applications," IEEE VLSI Cir./Tech Symp., Jun. 2010, pp. 229-230.
Cho, Woo Yeong et al., "A 0.18um 3.0V 64Mb Non-Volatile Phase-Transition Random-Access Memory (PRAM)," ISSCC, Feb. 2004, Sec. 2-1.
Choi, Sang-Jun et al., "Improvement of CBRAM Resistance Window by Scaling Down Electrode Size in Pure-GeTe Film," IEEE Elec. Dev., vol. 30, No. 2, Feb. 2009, pp. 120-122.
Choi, Youngdon et al., "A 20nm 1.8V 8Gb PRAM with 40MB/s Program Bandwidth," IEEE ISSCC, 2012, pp. 46-47.
Chung, S. et al., "A 1.25um2 Cell 32Kb Electrical Fuse Memory in 32nm CMOS with 700mV Vddmin and Parallel/Serial Interface," VLSI Cir. Symp., Jun. 2009, pp. 30-31.
Chung, S. et al., "A 512×8 Electrical Fuse Memory with 15um2 Cells Using 8-sq Asymmetrical Fuse and Core Devices in 90nm CMOS," VLSI Cir. Symp., Jun. 2007, pp. 74-75.
Crowley, Matthew et al., "512Mb PROM with 8 Layers of Antifuse/Diode Cells," IEEE ISSCC 2003, Sec. 16.4.
De Sandre, Guido et al., "A 4Mb LV MOS-Selected Embedded Phase Change Memory in 90nm Standard CMOS Technology," IEEE J. Sol. Stat. Cir, vol. 46. No. 1, Jan. 2011, pp. 52-63.
De Sandre, Guido et al., "A 90nm 4Mb Embedded Phase-Change Memory with 1.2V 12ns Read Access Time and 1MB/s Write Throughput," ISSCC 2010, Sec. 14.7.
Desikan, Rajagopalan et al., "On-Chip MRAM as a High-Bandwidth Low-Latency Replacement for DRAM Physical Memories," Tech Report TR-02-47, Dept. of Computer Science, University of Texas, Austin, Sep. 27, 2002, 18 pages.
Dietrich, Stefan et al., "A Nonvolatile 2-Mbit CBRAM Memory Core Featuring Advanced Read and Program Control," IEEE J. of Solid-Stat Cir., vol. 42, No. 4, Apr. 2007, pp. 839-845.
Dion, Michael J., "Reservoir Modeling for Electromigration Improvement of Metal Systems with Refractory Barriers," IEEE 39th IRPS, 2001, pp. 327-333.
Doorn, T. S. et al., "Ultra-fast Programming of Silicided Polysilicon Fuses Based on New Insights in the Programming Physics," IEEE IEDM, 2005, pp. 667-670.
Doorn, T. S., "Detailed Qualitative Model for the Programming Physics of Silicided Polysilicon Fuses," IEEE Trans. on Elec. Dev. vol. 54, No. 12, Dec. 2007, pp. 3285-3291.

Durlam, M. et al., "A 1-Mbit MRAM Based on 1T1MTJ Bit Cell Integrated With Copper Interconnects," IEEE J. of Solid-State Circuits, vol. 38, No. 5, May 2003, pp. 769-773.
Engel, B. et al., "The Science and Technology of Magnetoresistive Tunnel Memory," IEEE Tran. on Nanotechnology, vol. 1, No. 1, Mar. 2002, pp. 32-38.
Engel, B.N. et al., "A 4Mb Toggle MRAM Based on a Novel bit and Switching Method," IEEE Trans. on Mag. vol. 41, No. 1, Jan. 2005, pp. 132-136.
Fellner, Johannes, et al., "Lifetime Study for a Poly Fuse in a 0.35um Polycide CMOS Process," IEEE 43rd IRPS, 2005, pp. 446-449.
Gao, B. et al., "Oxide-Based RRAM: Uniformity Improvement Using a New Material-Oriented Methodology," IEEE VLSI Tech. Symp., Jun. 2009, pp. 30-31.
Gao, B. et al., "Oxide-Based RRAM Switching Mechanism: A New Ion-Transport-Recombination Model," IEDM, Dec. 2008, pp. 563-566.
Gill, M. et al., "Ovonic Unified Memory—A High Performance Nonvolatile Memory Technology for Stand-Alone Memory and Embedded Applications," IEEE, ISSCC Dig. of Tech. Paper, Feb. 2002, pp. 202-203.
Gogl, D. et al., "A 16-Mb MRAM Featuring Bootstrapped Write Drivers," IEEE J. of Solid-State Circuits, vol. 40, No. 4, Apr. 2005, pp. 902-908.
Gopalan, C. et al., Demonstration of Conductive Bridging Random Access Memory (CBRAM) in Logic CMOS Process, IEEE Int. Memory Workshop, 2010, pp. 1-4.
Ha, Daewon and Kim, Kinam, "Recent Advances in High Density Phase Change Memory (PRAM)," IEEE VLSI Tech. Symp. Jun. 2007.
Hosoi, Y. et al., "High Speed Unipolar Switching Resistance RAM (RRAM) Technology," IEEE IEDM, Dec. 2006, pp. 1-4.
Hosomi, M. et al., "A Novel Nonvolatile Memory with Spin Torque Transfer Magnetization Switching: Spin-RAM," IEEE IEDM Dig. of Tech. Paper, Dec. 2005, pp. 459-463.
Huang, Chia-En et al., "A New CMOS Logic Anti-Fuse Cell with Programmable Contact," IEEE IEDM Tech. Dig. 2007, pp. 48-51.
Im, Jay et al., "Characterization of Silicided Polysilicon Fuse Implemented in 65nm CMOS Technology,"7th Annual Non-Volatile Memory Technology Symp, (NVMTS) 2006, pp. 55-57.
Jin, Li-Yan et al., "Low-Area 1-Kb Multi-Bit OTP IP Design," IEEE 8th Int. Conf. on ASIC (ASICON), 2009. pp. 629-632.
Johnson, Mark et al., "512Mb PROM with a Three-Dimensional Array of Diode/Antifuse Memory Cells," IEEE J. of Sol. Stat. Cir., vol. 38, No. 11, Nov. 2003, pp. 1920-1928.
Kalnitsy, Alexander et al., "CoSi2 Integrated Fuses on Poly Silicon for Low Voltage 0.18um CMOS Applications," IEEE IEDM 1999, pp. 765-768.
Kang, Han-Byul et al., "Electromigration of NiSi Poly Gated Electrical Fuse and Its Resistance Behaviors Induced by High Temperature," IEEE IRPS, 2010, pp. 265-270.
Kang, Sangbeom et al., "A 0.1um 1.8V 256Mb Phase-Change Random Access Memory (PRAM) with 66 Mhz Synchronous Burst-Read," IEEE J. of Sol. Stat. Cir. vol 42, No. 1, Jan. 2007, pp. 210-218.
Kawahara, T. et al., "2Mb Spin-Transfer Torque RAM (SPRAM) with Bit-by-Bit Bidirectional Current Write and Parallelizing-Direction Current Read," IEEE ISSCC Dig. of Tech. Paper, Feb. 2007, pp. 480-481.
Ker, Ming-Dou et al., "High-Current Characterization of Polysilicon Diode for Electrostatic Discharge Protection in Sub-Quarter-Micron Complementary Metal Oxide Semiconductor Technology," Jpn. J. Appl. Phys. vol. 42 (2003) pp. 3377-3378.
Ker, Ming-Dou et al., "Ultra-High-Voltage Charge Pump Circuit in Low-Voltage Bulk CMOS Processes With Polysilicon Diodes," IEEE Trans. on Cir. and Sys.—II: Exp. Brief., vol. 54, No. 1, Jan. 2007, pp. 47-51.
Kim, Deok-Kee et al., "An Investigation of Electrical Current Induced Phase Transitions in the NiPtSi/Polysilicon System," J. App. Phy. 103, 073708 (2008).
Kim, I. S. et al., "High Performance PRAM Cell Scalable to sub-20nm Technology with below 4F2 Cell Size, Extendable to DRAM Applications," IEEE VLSI Tech Symp., Jun. 2010, pp. 203-204.

(56) References Cited

OTHER PUBLICATIONS

Kim, Jinbong et al., "3-Transistor Antifuse OTP ROM Array Using Standard CMOS Process," IEEE VLSI Cir. Symposium, Jun. 2003, pp. 239-242.
Kim, O. et al., "CMOS trimming circuit based on polysilicon fusing," Elec. Lett. vol. 34, No. 4, pp. 355-356, Feb. 1998.
Klee, V. et al., "A 0.13um Logic-Based Embedded DRAM Technology with Electrical Fuses, Cu Interconnect in SiLK, sub-7ns Random Access Time and its Extension to the 0.10um Generation," IEEE IEDM, 2001, pp. 407-410.
Kothandaramam, C. et al., "Electrically programmable fuse (eFUSE) using electromigration in silicides," IEEE Elec. Dev. Lett., vol. 23, No. 9, pp. 523-525, Sep. 2002.
Kulkarni, S. et al., "High-Density 3-D Metal-Fuse PROM Featuring 1.37um2 1T1R Bit Cell in 32nm High-K Metal-Gate CMOS Technology," VLSI Cir. Symp., Jun. 2009 pp. 28-29.
Kulkarni, S. et al., "A 4Kb Metal-Fuse OTP-ROM Macro Featuring a 2V Programmable 1.37um2 1T1R Bit Cell in 32nm High-K Metal-Gate CMOS," IEEE J. of Sol. Stat. Cir, vol. 45, No. 4, Apr. 2010, pp. 863-868.
Kund, Michael et al., "Conductive Bridging RAM (CBRAM): An Emerging Non-Volatile Memory Technology Scalable to Sub 20nm," IEEE IEDM 2005, pp. 754-757.
Lai, Han-Chao et al., "A 0.26um2 U-Shaped Nitride-Based Programming Cell on Pure 90nm CMOS Technology," IEEE Elec. Dev. Lett. vol. 28, No. 9, Sep. 2007, pp. 837-839.
Lai, S., "Current Status of the Phase Change Memory and Its Future," IEEE IEDM Dig. of Tech. Paper, Dec. 2003, pp. 255-258.
Lee, H. Y. et al., "Low Power and High Speed Bipolar Switching with a Thin Reactive Ti Buffer Layer in Robust HfO2 Based RRAM," IEEE IEDM, 2008, pp. 1-4.
Lee, K.J., et al., "A 90nm 1.8V 512Mb Diode-Switch PRAM with 266MB/s Read Throughout," IEEE ISSCC, Dig. of Tech. Paper, Feb. 2007, 3 pgs.
Lee, Kwang-Jin et al., "A 90nm 1.8V 512Mb Diode-Switch PRAM with 266MB/s Read Throughput," IEEE J. of Sol. Stat. Cir., vol. 43, No. 1, Jan. 2008, pp. 150-162.
Lee, M.-J. et al., "Stack Friendly all-Oxide 3D RRAM Using GaInZnO Peripheral TFT Realized Over Glass Substrates," IEDM, Dec. 2008. pp. 1-4.
Lee, Man Chiu et al., "OTP Memory for Low Cost Passive RFID Tags," IEEE Conf. on Electron Devices and Solid-State Circuits (EDSSC), 2007, pp. 633-636.
Liaw, Corvin et al., "The Conductive Bridging Random Access Memory (CBRAM): A Non-volatile Multi-Level Memory Technology," 37th European Solid-State Device Research Conference (ESSDERC), 2007, pp. 226-229.
Lim, Kyunam et al., "Bit Line Coupling Scheme and Electrical Fuse Circuit for Reliable Operation of High Density DRAM," IEEE VLSI Cir. Symp. Jun. 2001, pp. 33-34.
Maffitt, T. et al., "Design Considerations for MRAM," IBM J. Res. & Dev., vol. 50, No. 1, Jan. 2006, pp. 25-39.
Meng, X.Z. et al., "Reliability Concept for Electrical Fuses," IEE Proc.-Sci Meas. Technol., vol. 144, No. 2, Mar. 1997, pp. 87-92.
Min, Byung-Jun et al., "An Embedded Non-volatile FRAM with Electrical Fuse Repair Scheme and One Time Programming Scheme for High Performance Smart Cards," IEEE CICC, Nov. 2005, pp. 255-258.
Mojumder, N. N. et al., "Three-Terminal Dual-Pillar STT-MRAM for High Performance Robust Memory Applications," IEEE Trans. Elec. Dev. vol. 58. No. 5, May 2011, pp. 1508-1516.
Morimoto, T. et al., "A NiSi Salicide Technology for Advanced Logic Devices," IEEE IEDM, Dec. 1991, pp. 653-656.
Neale, Ron, "PCM Progress Report No. 6 Afterthoughts," http://www.eetimes.com/General/PrintView/4236240, Feb. 13, 2012, 5 pages.
Nebashi, R. et al., "A 90nm 12ns 32Mb 2T1MTJ MRAM," IEEE ISSCC Dig. of Tech. Paper, Sess. 27.4, Feb. 2009, 3 pages.

Ng, K.P. et al., "Diode-Base Gate Oxide Anti-Fuse One-Time Programmable Memory Array in Standard CMOS Process," IEEE Int. Conf. of Elect. Dev. & Solid-Stat Cir. (EDSSC), Dec. 2009, pp. 457-460.
Ohbayashi, Shigeki et al., "A 65nm Embedded SRAM With Wafer Level Burn-In Mode, Leak-Bit Redundancy and Cu E-Trim Fuse for Known Good Die," IEEE J. of Solid. Stat. Cir., vol. 43, No. 1, Jan. 2008, pp. 96-108.
Oh, G. H. et al., "Parallel Multi-Confined (PMC) Cell Technology for High Density MLC PRAM," IEEE VLSI Tech. Symp., Jun. 2009, pp. 220-221.
Oh, J. H. et al., "Full Integration of Highly Manufacturable 512Mb PRAM Based on 90nm Technology," IEEE IEDM Dig. of Tech. Paper, Dec. 2006, pp. 1-4.
Osada, K. et al., "Phase Change RAM Operated with 1.5V CMOS as Low Cost Embedded Memory," IEEE CICC, Nov. 2005, pp. 431-434.
Park, Don et al., "Study on Reliability of Metal Fuse for Sub-100nm Technology," IEEE Int. Symp. on Semiconductor Manufacturing (ISSM), 2005, pp. 420-421.
Park, Jongwoo et al., "Phase Transformation of Programmed NiSi Electrical Fuse: Diffusion, Agglomeration, and Thermal Stability," 18th IEEE Int. Symp. on Physical and Failure Analysis of Integrated Circuits, (IPFA), 2011, pp. 1-7.
Park, Young-Bae et al., "Design of an eFuse OTP Memory of 8 Bits Based on a 0.35um BCD Process," Mobile IT Convergence (ICMIC), 2011 Int. Conf. on, pp. 137-139.
Pellizzer, F. et al., "Novel uTrench Phase-Change Memory Cell for Embedded and Stand-alone Non-Volatile Memory Applications," IEEE VLSI Tech Symp. Jun. 2004, pp. 18-19.
Peng, J. et al., "A Novel Embedded OTP NVM Using Standard Foundry CMOS Logic Technology," IEEE 21st Non-Volatile Semiconductor Memory Workshop (NVSMW) 2006, pp. 24-26.
Rizzolo, R. F. et al., "IBM System z9 eFUSE applications and methodology," IBM J. Res. & Dev. vol. 51 No. ½ Jan./Mar. 2007, pp. 65-75.
Robson, Norm et al., "Electrically Programmable Fuse (eFuse) from Memory Redundancy to Autonomic Chips," IEEE CICC, 2007, pp. 799-804.
Russo, U. et al., "Conductive-Filament Switching Analysis and Self-Accelerated Thermal Dissolution Model for Reset in NiO-based RRAM," IEDM, Dec. 2007, pp. 775-778.
Safran, J. et al., "A Compact eFUSE Programmable Array Memory for SOI CMOS," VLSI Cir. Symp. Jun. 2007, pp. 72-73.
Sasaki, Takahiko et al., "Metal-Segregate-Quench Programming of Electrical Fuse," IEEE 43rd IRPS, 2005, pp. 347-351.
Schrogmeier, P. et al., "Time Discrete Voltage Sensing and Iterative Programming Control for a 4F2 Multilevel CBRAM," VLSI Cir. Symp., Jun. 2007, pp. 186-187.
Sheu, Shyh-Shyuan et al., "A 5ns Fast Write Multi-Level Non-Volatile 1K-bits RRAM Memory with Advance Write Scheme," VLSI Cir. Symp., Jun. 2009, pp. 82-83.
Sheu, Shyh-Shyuan et al., "Fast-Write Resistive RAM (RRAM) for Embedded Applications," IEEE Design & Test of Computers, Jan./Feb. 2011, pp. 64-71.
Shi, Min et al., "Zero-Mask Contact Fuse for One-Time-Programmable Memory in Standard CMOS Processes," IEEE Dev. Lett. vol. 32, No. 7, Jul. 2011, pp. 955-957.
Song, Y. J. et al., "Highly Reliable 256Mb PRAM with Advanced Ring Contact Technology and Novel Encapsulating Technology," IEEE VLSI Tech Symp., Jun. 2006, pp. 153-154.
Suto, Hiroyuki et al., "Programming Conditions for Silicided Poly-Si or Copper Electrically Programmable Fuses," IEEE IIRW Final Report, 2007, pp. 84-89.
Suto, Hiroyuki et al., "Study of Electrically Programmable Fuses Through Series of I-V Measurements," IEEE IIRW Final Report, 2006, pp. 83-86.
Suto, Hiroyuki et al., "Systematic Study of the Dopant-Dependent Properties of Electrically Programmable Fuses With Silicide Poly-Si Links Through a Series of I-V Measurements," IEEE Trans. on Dev. Mat. Rel. vol. 7, No. 2, Jun. 2007, pp. 285-297.
Takaoka, H. et al., A Novel Via-fuse Technology Featuring Highly Stable Blow Operation with Large On-off Ratio for 32nm Node and Beyond, IEDM, 2007, pp. 43-46.

(56) References Cited

OTHER PUBLICATIONS

Tehrani, S. et al., "Magnetoresistive Random Access Memory Using Magnetic Tunnel Junction," Proc. of IEEE, vol. 91, No. 5, May 2003, pp. 703-714.
Tehrani, S., "Status and Outlook of MRAM Memory Technology," IEEE IEDM Dig. of Tech Paper., Dec. 2006, pp. 1-4.
Teichmann, J. et al., "One Time Programming (OTP) with Zener Diodes in CMOS Processes," 33rd Conf. on European Solid-State Device Research (ESSDERC), 2003, pp. 433-436.
Tian, C. et al., "Reliability Investigation of NiPtSi Electrical Fuse with Different Programming Mechanisms," IEEE IIRW Final Report, 2007, pp. 90-93.
Tian, C. et al., "Reliability Qualification of CoSi2 Electrical Fuse for 90nm Technology," IEEE 44th IRPS, 2006, pp. 392-397.
Tian, Chunyan et al., "Reliability Investigation of NiPtSi Electrical Fuse with Different Programming Mechanisms," IEEE Trans. on Dev. Mat. Rel. vol. 8, No. 3, Sep. 2008, pp. 536-542.
Tonti, W. R. et al., "Product Specific Sub-Micron E-Fuse Reliability and Design Qualification," IEEE IIRW Final Report, 2003, pp. 36-40.
Tonti, W. R., "Reliability and Design Qualification of a Sub-Micro Tungsten Silicide E-Fuse," IEEE IRPS Proceedings, 2004, pp. 152-156.
Tonti, W. R., "Reliability, Design Qualification, and Prognostic Opportunity of in Die E-Fuse," IEEE Conference on Prognostics and Health Management (PHM), 2011, pp. 1-7.
Ueda, T. et al., "A Novel Cu Electrical Fuse Structure and Blowing Scheme utilizing Crack-assisted Mode for 90-45nm-node and beyond," IEEE VLSI Tech. Sym., Jun. 2006, 2 pages.
Ulman, G. et al., "A Commercial Field-Programmable Dense eFUSE Array Memory with 00.999% Sense Yield for 45nm SOI CMOS", ISSCC 2008/ Session 22 / Variation Compensation and Measurement/ 22.4, 2008 IEEE International Solid-State Circuits Conference, pp. 406-407.
Vimercati, Daniele et al., "A 45nm 1Gbit 1.8V PCM for Wireless and Embedded Applications," IEEE ISSCC Feb. 2010, 26 pages.
Vinson, J. E., "NiCr Fuse Reliability—A New Approach," Southcon/94, Conference Record, 1994, pp. 250-255.
Walko, J., "Ovshinsky's Memories," IEE Review, Issue 11, Nov. 2005, pp. 42-45.
Wang, J. P. et al., "The Understanding of Resistive Switching Mechansim in HfO2-Based Resistive Random Access Memory," IEDM, 2011, pp. 12.1.1-12.1.4.
Wikipedia, "Programmable read-only memory", http://en.wikipedia.org/wiki/Programmable_read-only_memory, downloaded Jan. 31, 2010, 4 pages.
Worledge, D.C., "Single-Domain Model for Toggle MRAM," IBM J. Res. & Dev. vol. 50, No. 1, Jan. 2006, pp. 69-79.
Wu, Kuei-Sheng et al., "The Improvement of Electrical Programmable Fuse with Salicide-Block Dielectrical Film in 40nm CMOS Technology," Interconnect Technology Conference (IITC), 2010 Int. pp. 1-3.
Wu, Kuei-Sheng et al., "Investigation of Electrical Programmable Metal Fuse in 28nm and beyond CMOS Technology," IEEE International Interconnect Technology Conference and 2011 Materials for Advanced Metallization (IITC/MAM), 2011, pp. 1-3.
Yin, M. et al., "Enhancement of Endurance for CuxO based RRAM Cell," 9th Int. Conf. on Solid-State and Integrated-Circuit Technology (ICSICT) 2008, pp. 917-920.
Zhu, Jian-Gang, "Magnetoresistive Random Access Memory: The Path to Competitiveness and Scalability," Proc. of IEEE, vol. 96, No. 11, Nov. 2008, pp. 1786-1798.
Zhuang, W. W. et al., "Novell Colossal Magnetonresistive Thin Film Nonvolatile Resistance Random Access Memory (RRAM)," IEEE IEDM 2002, pp. 193-196.
Notice of Allowance for U.S. Appl. No. 13/026,664 mailed Sep. 18, 2012.
Office Action for U.S. Appl. No. 13/471,704 mailed Jul. 31, 2012.
Notice of Allowance for U.S. Appl. No. 13/471,704 mailed Oct. 18, 2012.
Notice of Allowance for U.S. Appl. No. 13/026,678 mailed Sep. 19, 2012.
Office Action for U.S. Appl. No. 13/026,783 mailed Sep. 27, 2012.
Office Action for U.S. Appl. No. 13/026,717 mailed Oct. 25, 2012.
Office Action for U.S. Appl. No. 13/026,650 mailed Nov. 9, 2012.
Office Action for U.S. Appl. No. 13/026,692 mailed Nov. 9, 2012.
Office Action for U.S. Appl. No. 13/026,752 mailed Nov. 9, 2012.
Office Action for U.S. Appl. No. 13/026,656 mailed Nov. 13, 2012.
Office Action for U.S. Appl. No. 13/026,704 mailed Nov. 23, 2012.
Office Action for U.S. Appl. No. 13/397,673, mailed Dec. 18, 2012.
Office Action for U.S. Appl. No. 13/026,840, mailed Dec. 31, 2012.
Office Action for U.S. Appl. No. 13/026,852, mailed Jan. 14, 2013.
Office Action for U.S. Appl. No. 13/026,783, mailed Sep. 27, 2012.
Restriction Requirement for U.S. Appl. No. 13/026,835, mailed Dec. 12, 2012.
Notice of Allowance for U.S. Appl. No. 13/026,717, mailed Feb. 12, 2013.
Office Action for U.S. Appl. No. 13/471,704, mailed Jan. 25, 2013.
U.S. Appl. No. 13/761,048, filed Feb. 6, 2013.
U.S. Appl. No. 13/761,057, filed Feb. 6, 2013.
U.S. Appl. No. 13/761,097, filed Feb. 6, 2013.
U.S. Appl. No. 13/761,045, filed Feb. 6, 2013.
Office Action for U.S. Appl. No. 13/026,678, mailed Feb. 20, 2013.
Notice of Allowance for U.S. Appl. No. 13/026,783, mailed Mar. 4, 2013.
Notice of Allowance for U.S. Appl. No. 13/026,692, mailed Mar. 15, 2013.
Office Action for U.S. Appl. No. 13/026,704, mailed Nov. 23, 2012.
Notice of Allowance for U.S. Appl. No. 13/026,835, mailed Mar. 20, 2013.
Notice of Allowance for U.S. Appl. No. 13/026,664, mailed Apr. 22, 2013.
Notice of Allowance for U.S. Appl. No. 13/026,656, mailed Apr. 22, 2013.
Jagasivamani et al., "Development of a Low-Power SRAM Compiler", IEEE Press, 2001, pp. 498-501.
Liu et al., "A Flexible Embedded SRAM Compiler", IEEE Press, 2002, 3 pgs.
Sundrararajan, "OSUSPRAM: Design of a Single Port SRAM Compiler in NCSU FREEPDK45 Process", Mater of Science in Electrical Engineering, Oklahoma State University, Jul. 2010, 117 pgs.
Notice of Allowance for U.S. Appl. No. 13/026,835, Mailed Apr. 18, 2013.
Notice of Allowance for U.S. Appl. No. 13/026,704, mailed Apr. 30, 2013.
Notice of Allowance for U.S. Appl. No. 13/026,852, mailed May 10, 2013.
Notice of Allowance for U.S. Appl. No. 13/026,717, mailed May 15, 2013.
Notice of Allowance for U.S. Appl. No. 13/471,704, mailed May 22, 2013.
Notice of Allowance for U.S. Appl. No. 13/026,678, mailed May 28, 2013.
Notice of Allowance for U.S. Appl. No. 13/026,650, mailed May 30, 2013.
Restriction Requirement for U.S. Appl. No. 13/314,444, mailed Jun. 7, 2013.
Restriction Requirement for U.S. Appl. No. 13/214,198, mailed Jun. 13, 2013.
Notice of Allowance for U.S. Appl. No. 13/026,840, mailed Jun. 13, 2013.
Restriction Requirement for U.S. Appl. No. 13/026,771, mailed Jun. 13, 2013.
Notice of Allowance for U.S. Appl. No. 13/026,752, mailed Jul. 1, 2013.
Restriction Requirement for U.S. Appl. No. 13/678,543, mailed Jul. 8, 2013.
Office Action for U.S. Appl. No. 13/026,725, mailed Jul. 19, 2013.
Notice of Allowance for U.S. Appl. No. 13/026,664, mailed Jul. 22, 2013.
Notice of Allowance for U.S. Appl. No. 13/026,692, mailed Jul. 23, 2013.

(56) References Cited

OTHER PUBLICATIONS

Notice of Allowance for U.S. Appl. No. 13/397,673, mailed Jul. 30, 2013.
Notice of Allowance for U.S. Appl. No. 13/026,704, mailed Aug. 2, 2013.
Notice of Allowance for U.S. Appl. No. 13/026,783, mailed Aug. 5, 2013.
Office Action for U.S. Appl. No. 13/214,198, mailed Aug. 6, 2013.
Office action for Chinese Patent Application No. 201110279954.7, mailed Jul. 1, 2013.
Shen et al., "High-K Metal Gate Contact RRAM (CRRAM) in Pure 28 nm CMOS Logic Process", Electron Devices Meeting (IEDM), 2012 IEEE International, Dec. 2012, 4 pgs.
Tseng et al., "A New High-Density and Ultrasmall-Cell Size Contact RRAM (CR-RAM) with Fully CMOS-Logic-Compatible Technology and Circuits", IEEE Transactions on Electron Devices, vol. 58, Issue 1, Jan. 2011, 6 pgs.
Office Action for U.S. Appl. No. 13/026,783, mailed Sep. 9, 2013.
Office Action for U.S. Appl. No. 13/314,444, mailed Sep. 9, 2013.
Office Action for U.S. Appl. No. 13/026,771, mailed Sep. 9, 2013.
Notice of Allowance for U.S. Appl. No. 13/026,852, mailed Sep. 18, 2013.
Office Action (Ex Parte) for U.S. Appl. No. 13/678,543, mailed Sep. 20, 2013.
Office Action for U.S. Appl. No. 13/835,308, mailed Sep. 27, 2013.
Notice of Allowance for U.S. Appl. No. 13/026,717, mailed Oct. 1, 2013.
Office Action for U.S. Appl. No. 13/954,831, mailed Oct. 1, 2013.
Notice of Allowance for U.S. Appl. No. 13/026,656, mailed Oct. 4, 2013.
Office Action for U.S. Appl. No. 13/214,183, mailed Oct. 25, 2013.
Chua, "Many Times Programmable z8 Microcontroller", e-Gizmo.cim, Nov. 21, 2006, pp. 1-5.
Forum, Intel Multi-byte Nops, asmcommunity.net, Nov. 21, 2006, pp. 1-5.
CMOS Z8 OTP Microcontrollers Product Specification, Zilog Inc., May 2008, Revision 1, pp. 1-84.
OTP Programming Adapter Product User Guide, Zilog Inc., 2006, pp. 1-3.
Notice of Allowance for U.S. Appl. No. 13/026,852, mailed Nov. 15, 2013.
Notice of Allowance for U.S. Appl. No. 13/026,835, mailed Nov. 22, 2013.
Notice of Allowance for U.S. Appl. No. 13/026,725, mailed Dec. 10, 2013.
Office Action for U.S. Appl. No. 13/026,783, mailed Dec. 23, 2013.
Notice of Allowance for U.S. Appl. No. 13/026,771, mailed Jan. 15, 2014.
Office Action for Chinese Patent Application No. 201110244362.1, mailed Sep. 29, 2013.
Office Action for Chinese Patent Application No. 201110235464.7, mailed Oct. 8, 2013.
Office Action for Chinese Patent Application No. 201110244400.3, mailed Nov. 5, 2013.
Office Action for Chinese Patent Application No. 201110244342.4, mailed Oct. 31, 2013.
Restriction Requirement for U.S. Appl. No. 13/678,541, mailed Feb. 28, 2014.
Notice of Allowance for U.S. Appl. No. 13/026,840, mailed Mar. 6, 2014.
Notice of Allowance for U.S. Appl. No. 13/026,840, mailed Mar. 10, 2014.
Notice of Allowance of U.S. Appl. No. 13/678,543, mailed Dec. 13, 2013.
Notice of Allowance for U.S. Appl. No. 13/835,308, mailed Mar. 14, 2014.
Notice of Allowance for U.S. Appl. No. 13/026,835, mailed Mar. 14, 2014.
Notice of Allowance for U.S. Appl. No. 13/026,725, mailed Mar. 31, 2014.
Notice of Allowance for U.S. Appl. No. 13/026,852, mailed Mar. 20, 2014.
Notice of Allowance for U.S. Appl. No. 13/026,771, mailed Mar. 18, 2014.
Final Office Action for U.S. Appl. No. 13/214,183, mailed Apr. 17, 2014.
"Embedded Systems/Mixed C and Assembly Programming", Wikibooks, Aug. 6, 2009, pp. 1-7.
Notice of Allowance for U.S. Appl. No. 13/761,097, mailed Jul. 15, 2014.
Office Action for U.S. Appl. No. 13/571,797, mailed Apr. 24, 2014.
Notice of Allowance for U.S. Appl. No. 13/590,044, mailed Apr. 29, 2014.
Notice of Allowance for U.S. Appl. No. 13/954,831, mailed May 27, 2014.
Notice of Allowance of U.S. Appl. No. 13/833,044, mailed May 29, 2014.
Notice of Allowance for U.S. Appl. No. 13/761,048, mailed Jun. 10, 2014.
Office Action for Taiwanese Patent Application No. 100129642, mailed May 19, 2014 (with translation).
Office Action for U.S. Appl. No. 13/072,783, mailed Nov. 7, 2013.
Notice of Allowance for U.S. Appl. No. 13/026,840, mailed Jun. 24, 2014.
Notice of Allowance for U.S. Appl. No. 13/214,198, mailed Jun. 23, 2014.
Notice of Allowance for U.S. Appl. No. 13/590,044, mailed Jun. 23, 2014.
Ker et al., "MOS-bounded diodes for on-chip ESD protection in a 0.15-μm shallow-trench-isolation salicided CMOS Process" International Symposium on VLSI Technology, Systems and Applications, 2003, 5 pgs.
Notice of Allowance for U.S. Appl. No. 13/840,965, mailed Jun. 25, 2014.
Office Action for U.S. Appl. No. 13/970,562, mailed Jun. 27, 2014.
Office Action for U.S. Appl. No. 13/835,308, mailed Jun. 27, 2014.
Notice of Allowance for U.S. Appl. No. 13/288,843, mailed Jul. 8, 2014.
Restriction Requirement for U.S. Appl. No. 13/678,539, mailed Jul. 1, 2014.
Notice of Allowance for U.S. Appl. No. 14/231,413, mailed Jul. 18, 2014.
Notice of Allowance for U.S. Appl. No. 13/590,044, mailed Jul. 23, 2014.
Restriction Requirement for U.S. Appl. No. 13/833,067, mailed Jul. 11, 2014.
Notice of Allowance for U.S. Appl. No. 13/954,831, mailed Aug. 4, 2014.
Restriction Requirement for U.S. Appl. No. 13/678,544, mailed Aug. 1, 2014.
Notice of Allowance for U.S. Appl. No. 13/761,097, mailed Jul. 25, 2014.
Ex parte Quayle for U.S. Appl. No. 13/761,057, mailed Aug. 8, 2014.
Final Office Action for U.S. Appl. No. 13/314,444, mailed May 14, 2014.
Corrected Notice of Allowability for U.S. Appl. No. 13/288,843, mailed Aug. 19, 2014.
Office Action for U.S. Appl. No. 13/590,049, mailed Aug. 29, 2014.
Ex Parte Quayle for U.S. Appl. No. 13/590,047, mailed Aug. 29, 2014.
Ex Parte Quayle for U.S. Appl. No. 13/590,050, mailed Sep. 3, 2014.
Office Action for U.S. Appl. No. 13/678,544, mailed Sep. 12, 2014.
Office Action for U.S. Appl. No. 13/678,539, mailed Sep. 10, 2014.
Notice of Allowance for U.S. Appl. No. 13/288,843, mailed Sep. 18, 2014.
Notice of Allowance for U.S. Appl. No. 13/761,057, mailed Sep. 26, 2014.
Notice of Allowance for U.S. Appl. No. 13/833,044, mailed Sep. 24, 2014.
Notice of Allowance for U.S. Appl. No. 13/314,444, mailed Sep. 24, 2014.
Office Action for U.S. Appl. No. 13/761,045, mailed Sep. 30, 2014.

(56) References Cited

OTHER PUBLICATIONS

Notice of Allowance for U.S. Appl. No. 13/835,308, mailed Oct. 10, 2014.
Notice of Allowance for U.S. Appl. No. 13/571,797, mailed Oct. 14, 2014.
Office Action for U.S. Appl. No. 13/833,067, mailed Oct. 20, 2014.
Notice of Allowance for U.S. Appl. No. 14/085,228, mailed Oct. 23, 2014.
Office Action for U.S. Appl. No. 13/842,824, mailed Oct. 29, 2014.
Herner et al., "Vertical p-i-n Polysilicon Diode with Antifuse for stackable Field-Programmable ROM", IEEE Electron Device Letters, vol. 25, No. 5, pp. 271-273, May 2004.
Notice of Allowance for U.S. Appl. No. 13/590,049, mailed Nov. 25, 2014.
Notice of Allowance for U.S. Appl. No. 13/590,047, mailed Nov. 24, 2014.
Office Action for U.S. Appl. No. 13/590,044, mailed Dec. 9, 2014.
Notice of Allowance for U.S. Appl. No. 13/590,050, mailed Dec. 18, 2014.
Office Action for U.S. Appl. No. 14/042,392, mailed Dec. 31, 2014.
Office Action for U.S. Appl. No. 14/071,957, mailed Dec. 29, 2014.
International Search Report and Written Opinion for International Patent Application No. PCT/US/2014/056676, mailed Dec. 19, 2014.
Office Action for U.S. Appl. No. 14/493,083, mailed Jan. 8, 2015.
Office Action for Chinese Patent Application No. 2011102443903, mailed Dec. 16, 2014 (with translation).
Notice of Allowance for U.S. Appl. No. 13/970,562, mailed Jan. 23, 2015.
Notice of Allowance for U.S. Appl. No. 14/493,069, mailed Feb. 17, 2015.
Notice of Allowance for U.S. Appl. No. 14/085,228, mailed Feb. 18, 2015.
Notice of Allowance for U.S. Appl. No. 13/761,045, mailed Feb. 18, 2015.
Notice of Allowance for U.S. Appl. No. 14/231,404, mailed Jan. 22, 2015.
Notice of Allowance for U.S. Appl. No. 14/021,990, mailed Dec. 9, 2014.
Final Office Action for U.S. Appl. No. 13/678,544, mailed Feb. 15, 2015.
Office Action for U.S. Appl. No. 14/101,125, mailed Mar. 6, 2015.
Hassan, "Argument for anti-fuse non-volatile memory in 28nm high-k metal gate", Feb. 15, 2011, wwwl.eeetimes.com publication.
Office Action for U.S. Appl. No. 13/026,783, mailed on Mar. 5, 2015.
Final Office Action for U.S. Appl. No. 13/678,539, mailed Apr. 1, 2015.
Office Action for U.S. Appl. No. 14/636,155, mailed on Apr. 10, 2015.
Notice of Allowance for U.S. Appl. No. 14/021,990, mailed Apr. 14, 2015.
Notice of Allowance for U.S. Appl. No. 13/842,824, mailed Apr. 14, 2015.
Notice of Allowance for U.S. Appl. No. 14/071,957, mailed Apr. 14, 2014.
Notice of Allowance for U.S. Appl. No. 14/231,404, mailed Apr. 17, 2015.

\* cited by examiner

US 9,183,897 B2

CIRCUITS AND METHODS OF A SELF-TIMED HIGH SPEED SRAM

CROSS-REFERENCE TO RELATED APPLICATIONS

This application claims priority of U.S. provisional Patent Application No. 61/708,040, filed on Sep. 30, 2012 and entitled "Circuits and Methods of A Self-Timed High Speed SRAM," which is hereby incorporated herein by reference.

BACKGROUND OF THE INVENTION

1. Field of the Invention

The present invention relates to effective circuit, system designs, and methods of a self-timed SRAM for high speed and low power applications.

2. Description of the Related Art

Today's SRAM is commonly used as caches in ultra-high clock-rate CPU. A clock rate of 1 GHz CPU can be achieved easily in today's nanometer devices, such as 65 nm CMOS and beyond. For an SRAM to match such high clock rate, the access time needs to be less than 1 ns. In such short period of time, it would be very hard to generate control signals to keep propagation delay short while keeping inactive block idle to meet both high speed and low power. It is the objective of this invention to achieve high speed, low power, and small area to meet the very demanding SRAM requirements in today's applications.

A conventional SRAM memory cell is shown in FIG. 1. The cell 10 consists of a cross-coupled latch constructed from inverters 11 and 12, two pass transistors 13 and 14. The input of the inverter 11 NB is coupled to the output of the inverter 12, and the input of the invert 12 N is coupled to the output of the inverter 11. The sources of MOS 13 and 14 are coupled to the two nodes N and NB, respectively. The MOS 13 and 14 have their sources coupled to nodes N and NB, their gates coupled to a wordline (WL), their drains coupled to bitline (BL) and bitline bar (BLB), respectively. The SRAM cell can be organized as a two-dimensional array with all BLs and BLBs of the cells in the same columns coupled together in vertical direction and all wordlines of the cells in the same row coupled together in horizontal direction. The SRAM cell can be read by pre-charging the BL and BLB to a high voltage (i.e. VDD) and then let floating. The BL or BLB voltage can be pulled low by the inverter 11 or 12 in the cell, depending if the data stored is 0 or 1, when the WL is turned on. Similarly, the SRAM cell can be written with data 0 or 1, by pulling BL or BLB low, respectively, when the WL is turned on.

A conventional sense amplifier (SA) of an SRAM is shown in FIG. 2. The latch-type SA 20 has a structure very similar to the SRAM cell shown in FIG. 1. The SA is based on the positive feedback of a latch to amplifier the input signals so that the gain can be high and the power consumption can be low. The SA can be activated when the input signals reach sufficient differential voltages; otherwise incorrect data may be sensed instead. The SA 20 has PMOS 21-1 and NMOS 21-2 constructed as an inverter with their gates coupled to QB, their sources coupled to VDD and ground through a NMOS 25, respectively. The drain of PMOS 21-1 is coupled to the drain of NMOS 21-2 and to a node Q. The SA 20 also has PMOS 22-1 and NMOS 22-2 constructed as an inverter with their gates coupled to Q, their sources coupled to VDD and ground through the NMOS 25, respectively. The drain of PMOS 22-1 is coupled to the drain of NMOS 22-2 and to a node QB. The sources of NMOS 21-2 and 22-2 are coupled to the drain of the same NMOS 25, whose gate is coupled to an SA enable (SE) and whose source is coupled to ground. The nodes Q and QB are coupled to the sources of PMOS 23 and 24, respectively. The drains of PMOS 23 and 24 are coupled to DI and DIB, respectively. The gates of PMOS 23 and 24 are coupled to an SA input enable (SIB). Two PMOS 26-1 and 26-2 are pullup devices for nodes QB and Q, respectively, with the gates coupled to SE.

The SA shown in FIG. 2 works as follows. Before sensing, SE is low and the nodes Q and QB are pulled high to VDD by a pair of PMOS pull-ups 26-2 and 26-1, respectively. When the signals at DI and DIB reach sufficient voltage difference (i.e. 100 mV split), SIB can be pulled low to allow signals coming into the nodes Q and QB, respectively. After the differential voltages are passed from DI/DIB to Q/QB, SE can be turned on to pull the drain of MOS 25 low while disabling PMOS 26-1 and 26-2. At the mean time, the SIB can be set to low to turned off the PMOS 23 and 24 to isolate the input signals from the internal nodes Q and QB in the SA. Subsequently, the cross-coupled latch consisting of PMOS 21-1 and 22-1 can be activated to make Q and QB split wider and reach rail-to-rail levels eventually. The cross-coupled latch consists of NMOS 21-2 and 22-2 can also be activated when the NMOS 25 is more heavily turned on. The timing of turning on SE is very crucial only after substantial signal splits are developed at nodes Q and QB, otherwise wrong data can be sensed and latched instead.

FIG. 3(a) shows a block diagram 30 of a portion of a self-timed circuit in a prior art. A memory cell array 31 has a reference column 32 that consists of 3 reference cells 33-1, 33-2, and 33-3, and some dummy cells 35 to fill up a column. The reference cells can be modified slightly from the normal cells to make reference BL pulled low earlier and then used as a control signal to trigger at least one SA.

FIG. 3(b) shows a schematic of a reference cell 40, corresponding to the reference cells 33-1 through 33-3 in FIG. 3(a), in a prior art. The reference cell 40 has a pair of cross-coupled inverters 41 and 42 constructed as a latch, and two pass transistors 43 and 44, similar to a normal SRAM cell. However, the gates of the pass transistor 43 and 44 are coupled to BLin (equivalent to BL in the normal cell), and the drain of the NMOS 43 is coupled to high (i.e. VDD). When BLin is set high, RBL can be pulled low. If the three reference cell 33-1, 33-2, and 33-3 in FIG. 3(a) have their BLin coupled together and have one shared RBL, RBL can be pulled down faster than any normal cells pulling down BL/BLB. As a result, RBL can be used to trigger an SA. BLin signal can be generated from a control signal, such as a clock CLK, through a multi-tap delay chain 45. Turning on BLin with respect to CLK can be adjusted by setting a plurality of delay control signals or a plurality of registers.

To achieve a reliable SRAM function with low power consumption, it is desirable to turn on the selected WL while turning off BL pullups only during the memory cells are ready for access. FIG. 4(a) shows a portion of a schematic 50 of a self-timed circuit in a prior art. The schematic 50 has a plurality of address buffers 57, pre-decoders 58, and decoders 59. The address buffer 57 consists of inverters 51-1, 51-2 and 51-3 to generate true and complement addresses, respectively. The pre-decoder 58 has a multi-input NAND 52-1 and followed by a buffer 52-2. The decoder 59 has a multi-input NAND 53-1 and followed by a wordline driver 53-2 to drive a WL. The addresses generated from the address buffers 57 are then input to a plurality of pre-decoders 58 to generate more pre-decoded signals, which are then input to a plurality of decoders 59 to fully decode the available address space. A WL can be turned on by using a wordline enable (WLEN) in one of the input in one of the pre-decoders. WLEN can be generated from a control signal, such as a clock CLK, through a multi-tap delay line 54. The delay line 54 can be controlled by a plurality of delay control signals or a plurality of registers.

The relative timing between CLK and WLEN is shown in FIG. 4(b). There is a parameter Twld to specify the turning on of WLEN after CLK transitions to deliver a new address. If a WL is turned on too early, excess power may be wasted. If a WL is turned on too late, the speed may be penalized. Another parameter Twlp is related to the WL pulse width. If Twlp is too narrow, sufficient BL/BLB split may not be developed before the WL is turned off again. If Twlp is too wide, excess power may be wasted. These two parameters can be used to illustrate the concept of tradeoff between speed and power.

The self-timed circuit as shown in FIGS. 3(a), 3(b), 4(a), and 4(b) are not self-timed precisely. The turning on of RBL is not tracking with WL turn-on time. The turning off of a WL is not tracking with SA enabling or disabling either. As a result, RBL may turn on an SA when the input signals are not split wide enough, or even before the selected WL is turned on at the worse. The selected WL may be turned off prematurely before sufficient signal splits reaching the inputs of an SA and sensed. Consequently, wide timing margins are needed to build a robust SRAM; otherwise yield and reliable operations may suffer. Therefore, it is still very desirable to invent some precise self-timed circuits to reduce timing margins to meet today's very demanding SRAM requirements.

SUMMARY

Embodiments of highly effective and robust circuits and methods for achieving high precision self-timed designs are disclosed. Embodiment are able to achieve very high speed and yet with sufficient margins to meet both the performance and functionality requirements.

In one embodiment, the turning on of a sense amplifier (SA) can be tracked with turning on of a selected wordline (WL) and/or bitline/bitline bar (BL/BLB). In another embodiment, the turning off of a selected WL can be tracked with SA enabling or disabling. These two timings can be very critical for high performance memory designs. If the first timing is not well met, an SA may be activated before sufficient signal splits are developed at the input of the SA and sensed wrong data. If the second timing is not well met, the selected WL may be turned off prematurely even before an SA is activated. In either case, the SA may sense cell data incorrectly. To ensure proper operations, tracking can be dependent on the strength of cell devices, wordline delay, bitline delay, and the configurations of the memory array, such as number of rows and columns, so that high speed and yet reliable operation can be achieved for wide ranges of voltage supplies, process corners, and temperatures.

Circuits and methods for precisely self-timed SRAM memory are disclosed to track the wordline and/or bitline/bitline bar (BL/BLB) propagation delays. At least one reference cell can be placed near the far end of a driver to drive a selected wordline or a reference wordline. When a wordline and/or a reference wordline is turned on, the reference cell can be selected not earlier than any selected SRAM cells and can activate a reference bitline (RBL) not later than any selected SRAM cells activating the BL or BLB. The activation of the RBL can be used to trigger at least one sense amplifier. The RBL can also be used to de-select wordline or reference wordline after the sense amplifier operation is complete to save power. The reference cell can have substantially the same device size, area, shape, and structure as a normal SRAM cell, but has a bitline in (BLin) coupled to the input of an inverter and the reference bitline (RBL) coupled to the output of the inverter. The BLin and RBL are similar to BL and BLB of an SRAM cell, respectively. The driving capability of the reference cell can be enhanced by enlarging the size of the inverter in a single reference cell or by combining the inverter outputs in a plurality of reference cells with proper setting in BLIns. The setting can be stored in registers for loading.

The invention can be implemented in numerous ways, including as a method, system, device, or apparatus (including computer readable medium). Several embodiments of the invention are discussed below.

As an embodiment in an integrated circuit, one embodiment can, for example, include at least one reference cell associated with a normal wordline or a reference wordline. The reference cells can be very similar to the normal cells but has higher pulldown capability that can be adjusted optionally by a plurality of control signals or registers. The selected reference cells can be turned on shortly after the last normal cell in a selective wordline is turned on. The selected reference cells can pulldown a reference bitline (RBL) faster than any selected normal cells pulling down the normal BL or BLB. Then, the RBL can be used to trigger at least one sense amplifier (SA) after proper buffering. The SA triggering signal can also be used to de-assert a wordline enable (WLEN) to turn off the selected wordline and/or reference wordline to complete a memory access.

As an electronics system, one embodiment can, for example, include at least a processor, and a self-timed SRAM memory operatively connected to the processor. The SRAM memory has at least one self-timed circuit, which in one embodiment can, for example, include at least one reference cell associated with a normal wordline or a reference wordline. The reference cells can be very similar to the normal cells but has higher pulldown capability that can be adjusted optionally by a plurality of control signals or registers. The selected reference cells can be turned on shortly after the last selected normal cell is turned on. The selected reference cells can pulldown a reference bitline (RBL) faster than any selected normal cells pulling down the normal BL or BLB. Then, the RBL can be used to trigger at least one sense amplifier (SA) after proper buffering. The SA triggering signal can also be used to de-assert a wordline enable (WLEN) to turn off a wordline and/or reference wordline to complete a memory access.

As a method for providing effective self-timed embodiments for an SRAM memory, one embodiment can, for example, include at least one reference cell associated with a normal wordline or a reference wordline. The reference cells can be very similar to the normal cells but has higher pulldown capability that can be adjusted optionally by a plurality of control signals or registers. The selected reference cells can be turned on shortly after the last selected normal cell is turned on. The selected reference cells can pulldown a reference bitline (RBL) faster than any selected normal cells pulling down the normal BL or BLB. Then, the RBL can be used to trigger at least one sense amplifier (SA) after proper buffering. The SA triggering signal can also be used to de-assert a wordline enable (WLEN) to turn off a wordline and/or reference wordline to complete a memory access.

BRIEF DESCRIPTION OF THE DRAWINGS

The present invention will be readily understood by the following detailed descriptions in conjunction with the accompanying drawings, wherein like reference numerals designate like structural elements, and in which.

DETAILED DESCRIPTION OF EMBODIMENTS OF THE INVENTION

Embodiments disclosed herein can track wordline and/or bitline delays to activate at least one sense amplifier (SA) and to turn off a wordline after at least one sense amplifier (SA) is activated. A latch-type of SA is essential in today's nanometer SRAM for low power and low voltage operations. However, the latch-type of SA requires sufficient signal splits developed in the input of an SA before being activated; otherwise irrevocable incorrect data can be sensed and latched. Without sufficient timing margins, the input signals may not be split wide enough for sensing. On the other hand, if the timing margins are too wide, the speed of an SRAM can suffer. Advantageously, embodiments disclosed herein are capably of tracking critical timings to achieve reliable operations and yet high speed by using at least one reference cell, similar to the normal cell, to track wordline and/or bitline delay and to turn on at least one sense amplifier accordingly. After the SA is activated, the selected wordline can be turned off by using the same tracking signal after proper buffering. Thus robust design with high speed operations can be achieved.

Circuits and methods for precisely self-timed SRAM memory are disclosed to track the wordline and/or bitline/bitline bar (BL/BLB) propagation delays. At least one reference cell can be placed near the far end of a driver to drive a selected wordline or a reference wordline. When a reference and/or a reference wordline is turned on, the reference cell can be selected not earlier than any selected SRAM cells and can activate a reference bitline (RBL) not later than any selected SRAM cells activating the BL or BLB. The activation of the RBL can be used to trigger at least one sense amplifier. The RBL can also be used to de-select wordline or reference wordline after the sense amplifier operation is complete to save power. The reference cell can have substantially the same device size, area, shape, and structure as a normal SRAM cell, but has a bitline in (BLin) coupled to the input of an inverter and the reference bitline (RBL) coupled to the output of the inverter. The BLin and RBL are similar to BL and BLB of an SRAM cell, respectively. The driving capability of the reference cell can be enhanced by enlarging the size of the inverter in a single reference cell or by combining the inverter outputs in a plurality of reference cells with proper setting in BLins. The setting can be stored in registers for loading.

Exemplary embodiments of the invention are discussed below with reference to the figures. However, those skilled in the art will readily appreciate that the detailed description given herein with respect to these figures is for explanatory purposes as the invention extends beyond these limited embodiments.

Figure 5A:
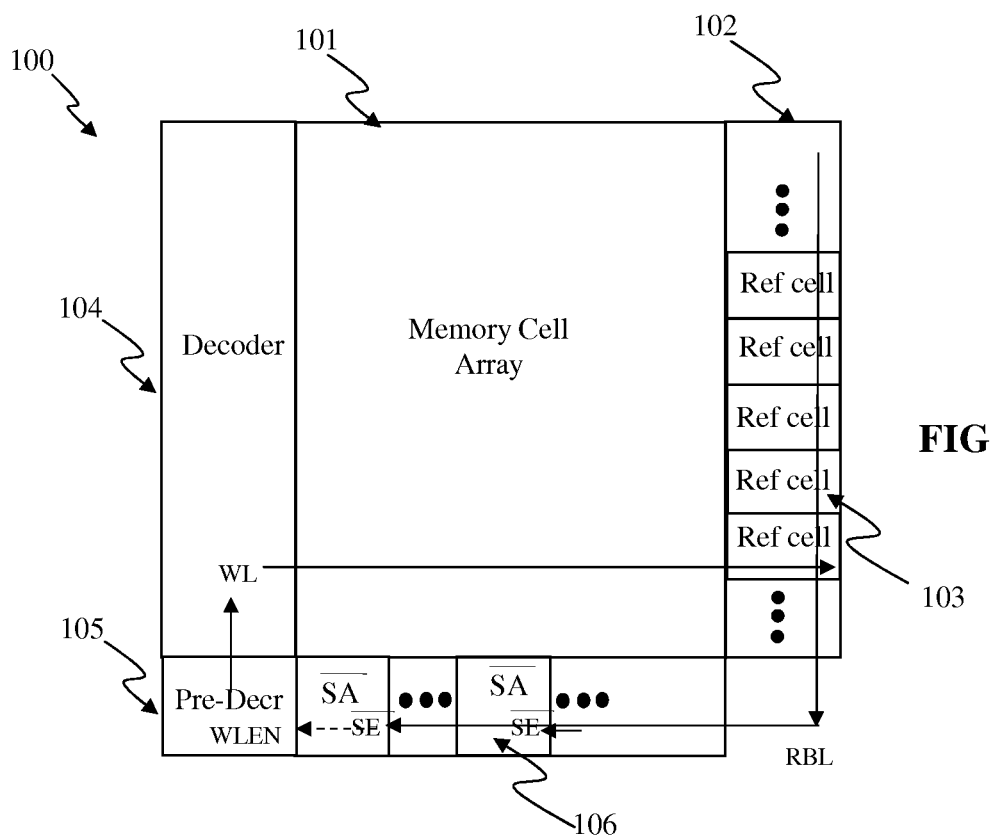
FIG. 5(a) shows a portion of a block diagram of a self-timed circuit according to one embodiment.

FIG. 5(a) shows a block diagram of a portion of a self-timed SRAM memory 100 according to one embodiment of the present invention. The SRAM memory 100 has an SRAM memory array 101, at least one reference column 102 that includes at least one reference cell 103, at least one sense amplifier 106, a plurality of pre-decoders 105, and decoders 104. In this embodiment, there is at least one reference cell hung on the far end of a wordline driver to drive a wordline. The SRAM 100 has incoming addresses pre-decoded in the pre-decoder 105. Then the pre-decoded addresses are further input to the decoders 104 to select one from a plurality of wordlines to access at least one memory cells in a row. The wordline can be enabled by gating a wordline enable signal (WLEN) to an input of a pre-decoder or decoder. At the far end of a wordline driver in the decoders 104, there is at least one reference cell 103 in at least one reference column 102 that can be turned on by the same selected normal wordline. The reference cell 103 has a similar circuit, device size, area, and structure as the normal cells except that the reference cell 103 has a higher pulldown capability than any normal cells, presumably the BL and RBL are pre-charged to high before accesses. After the selected wordline is turned on, the selected reference cell can pull down a reference bitline (RBL) faster than any selected normal cells pulling down BLs or BLBs, depending on the data being 0s or 1s. The RBL can be used to trigger at least one sense amplifier (SA) 106 after proper buffering. With this configuration, the activation of the SA can be ensured after all cells in the same selected row are turned on and sufficient signal splits are developed between BLs and BLBs. Once the SA is activated, the selected WL can be turned off by using the same RBL signal to de-assert WLEN in the pre-decoder 105 or decoder 104 after proper buffering. Subsequently, the wordline driver in the decoder 104 can be disabled to turn off the selected wordline. In another embodiment, the pulldown strength of the reference cells hung on each wordline can be adjusted by setting a plurality of control signals or registers.

Figure 5B:
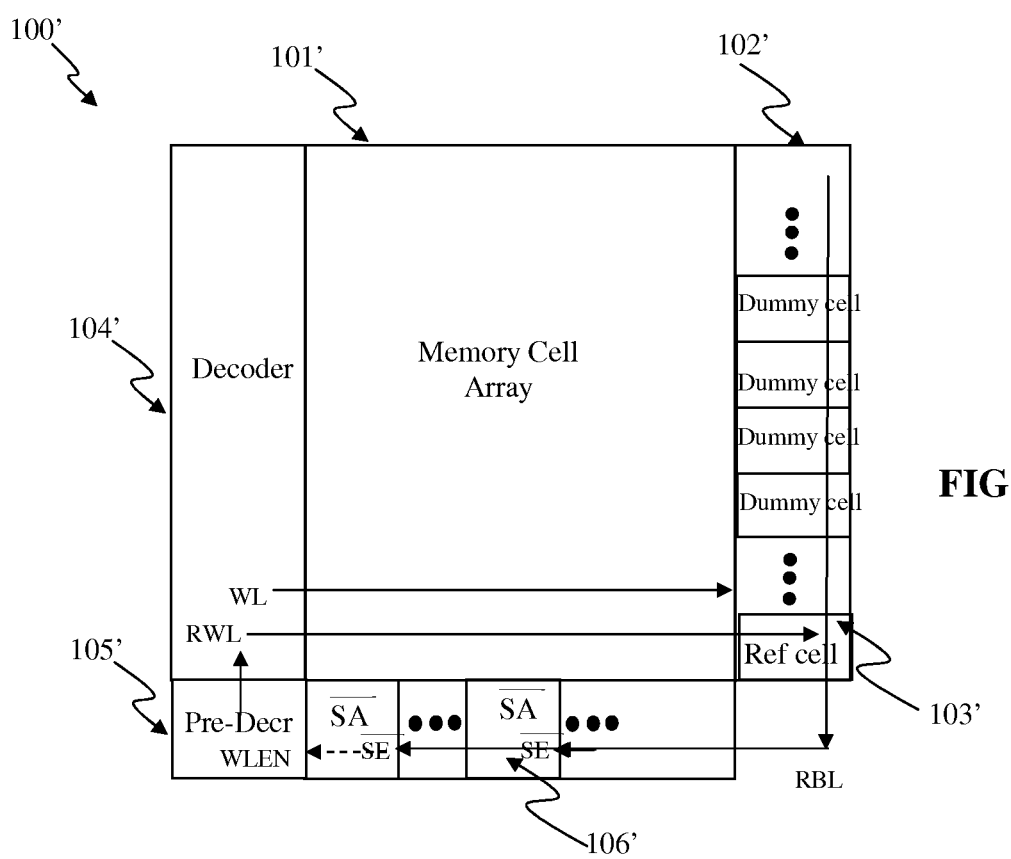
FIG. 5(b) shows a portion of a block diagram of a self-timed circuit according to another embodiment.
Figure 6A:
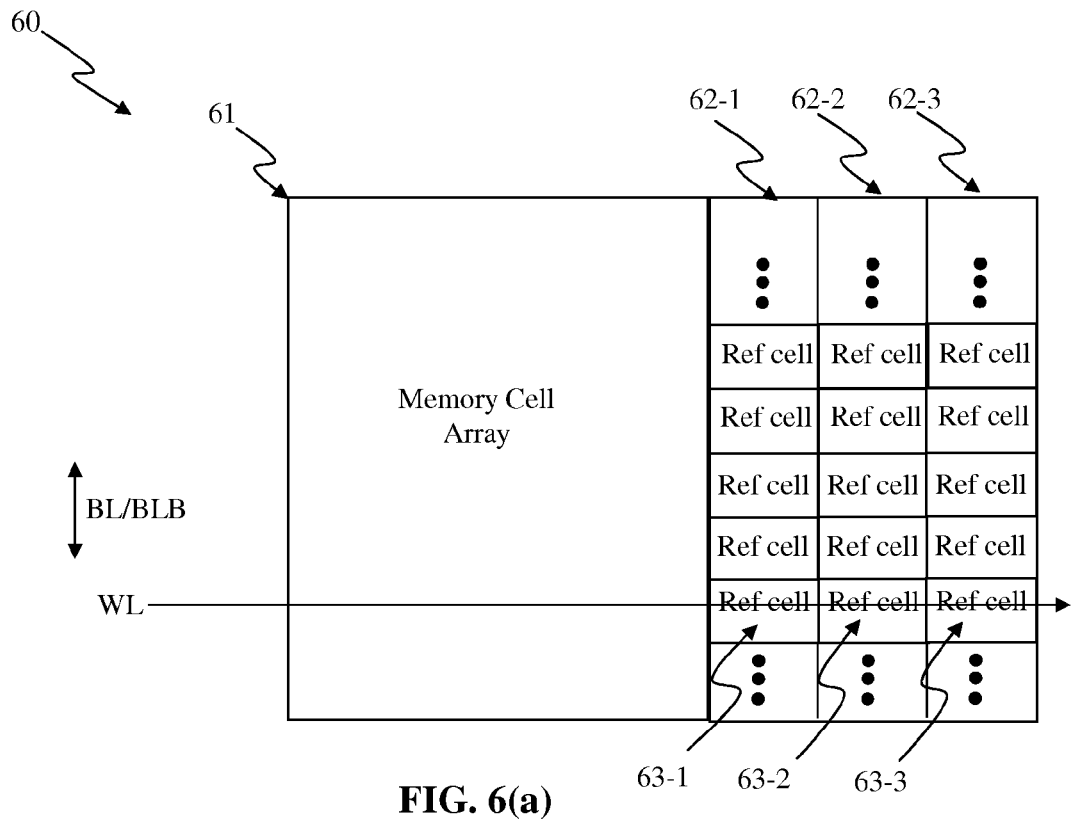
FIG. 6(a) shows a portion of a block diagram of a memory array using self-timed circuit according to one embodiment.
Figure 6B:
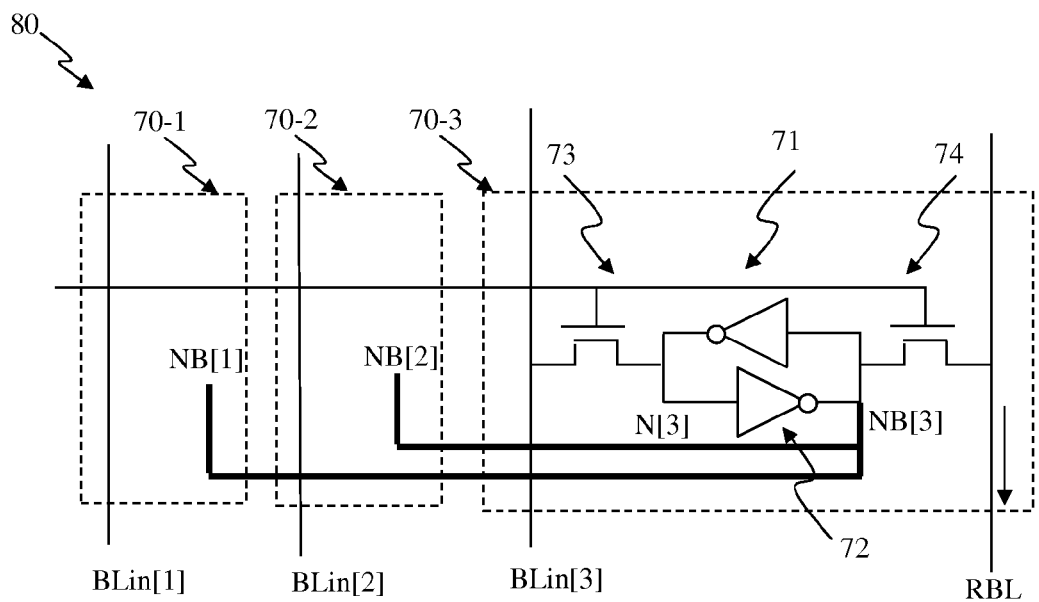
FIG. 6(b) shows a portion of a schematic of a reference cell corresponding to the reference cells in FIG. 5(a), 5(b), or 6(a) according to one embodiment.
Figure 6C:
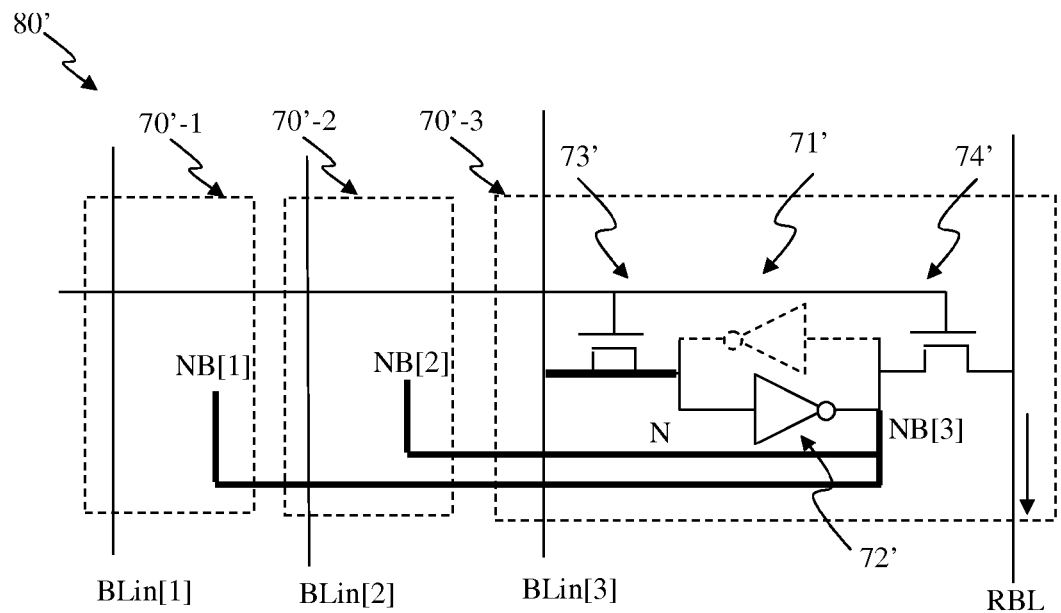
FIG. 6(c) shows a portion of a schematic of another reference cell corresponding to the reference cells in FIG. 5(a), 5(b), or 6(a) according to another embodiment.
Figure 6D:
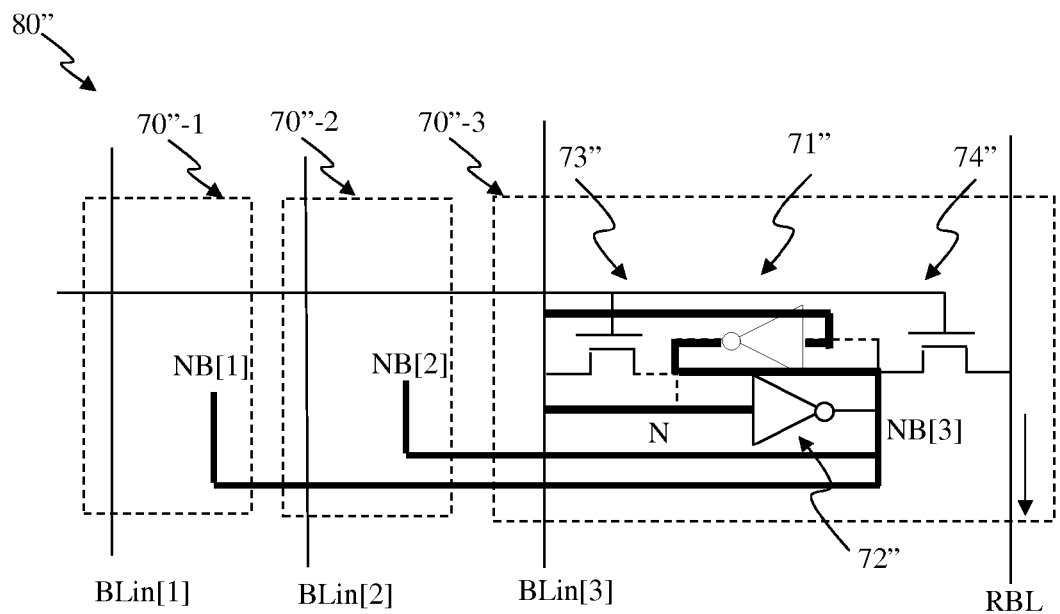
FIG. 6(d) shows a portion of a schematic of yet another reference cell corresponding to the reference cells in FIG. 5(a), 5(b), or 6(a) according to yet another embodiment.

FIG. 5(b) shows a block diagram of a portion of a self-timed SRAM memory 100' according to another embodiment of the present invention. The SRAM memory 100' has an SRAM memory array 101', at least one reference column 102' that includes at least one reference cell 103', at least one sense amplifier 106', pre-decoders 105', and decoders 104'. In this embodiment, there is at least one reference cell hung on the far end of a reference wordline driver to drive and turn on at least one reference wordline (RWL) whenever a normal wordline is turned on. The SRAM 100' has incoming addresses pre-decoded in the pre-decoder 105'. Then the pre-decoded addresses are further input to decoders 104' to select a wordline from a plurality of wordlines to access at least one cell in a row. The wordline can be enabled by gating a wordline enable signal (WLEN) to an input of a pre-decoder or decoder. At the same time, at least one reference wordline (RWL) can be turned on along with turning on a selected wordline. The reference cell 103' has a similar circuit, size, area, and structure as any normal cells except that the reference cell 103' has a higher pulldown capability than any normal cells, presumably the BL and RBL are pre-charged to high before accesses. After the reference wordline is turned on, the selected reference cell can pulldown a reference bitline (RBL) faster than any selected normal cells pulling down BLs or BLBs after the selected normal wordline is turned on. The RBL can be used to trigger at least one sense amplifier (SA) 106' after proper buffering. With this configuration, the SA can be activated surely after all cells in the selected normal row are turned on and sufficient signal splits are developed between BLs and BLBs. Once the SA is activated, the WL and RWL can be turned off by using the same RBL signal to de-assert WLEN in the pre-decoders 105' or decoders 104' after proper buffering. Subsequently, the selected wordline and reference wordline drivers in the decoder 104' can be de-asserted to turn off the selected wordline and reference wordline, respectively. In another embodiment, the pulldown strength of the reference cells hung on each reference wordline can be adjusted by setting a plurality of control signals or registers.

FIG. 6(*a*) shows a block diagram 60 of a portion of an SRAM memory, corresponding to the SRAM in the FIG. 5(*a*), according to one embodiment. The SRAM memory 60 has at least one memory cell array 61, a plurality of reference columns 61-1, 61-2, and 61-3 that have at least one reference cell 63-1, 63-2, and 63-3, respectively. The reference cell has a similar area, device size, circuit, and structure as the normal cells. The pulldown devices in three reference cells on the same wordline can be combined to provide three times of pulldown capability than a normal cell.

FIG. 6(*b*) shows a schematic of a reference cell triple 80, corresponding to the reference cell 103 in FIG. 5(*a*), reference cell 103' in FIG. 5(*b*), or reference cells 63-1 through 63-3 in FIG. 6(*a*), according to one embodiment. The reference cell triple 80 has three reference cells 70-1, 70-2, and 70-3. Each reference latch has two cross-coupled inverters 71 and 72 to constitute a latch. The latch has a node N coupled to a source of an NMOS 73 and whose drain is coupled to a BLin. The latch has another node NB coupled to a source of another NMOS 74 and whose drain is coupled to a RBL. The gates of the NMOS 73 and 74 are coupled to a reference wordline (RWL) or wordline (WL). The reference cells 70-1, 70-2, and 70-3 can be modified from normal cells by coupling NB[1] and NB[2] of the reference cells 70-1 and 70-2 to NB[3] of the reference cell 70-3 to triple the pulldown capability, if BLin [1], BLin[2], and BLin[3] are set to high. BLin[1], BLin[2], or BLin[3] can be optionally set to high or low to adjust the pulldown strength so that the turn-on time of RBL can be adjusted accordingly. BLin[1], BLin[2], or BLin[3] can also be controlled by setting three register bits. In another embodiment, the invert 71 can be omitted from schematic/layout database or disabled by removing contact(s) or via(s).

FIG. 6(*c*) shows a schematic of a reference cell triple 80', corresponding to the reference cell 103 in FIG. 5(*a*), reference cell 103' in FIG. 5(*b*), or reference cells 63-1 through 63-3 in FIG. 6(*a*), according to one embodiment. The reference cell triple 80' has three reference cells 70'-1, 70'-2, and 70'-3. Each reference latch has two cross-coupled inverters 71' and 72' to constitute a latch. The latch has a node N coupled to a source of an NMOS 73' and whose drain is coupled to a BLin. The latch also has a node NB coupled to a source of an NMOS 74' and whose drain is coupled to a RBL. The source and drain of the NMOS 73' are shorted to allow the BLin pulling RBL low easier. The gates of the NMOS 73' and 74' are coupled to a reference wordline (RWL) or wordline (WL). The reference cells 70'-1, 70'-2, and 70'-3 can be modified from normal cells by coupling the NB[1] and NB[2] of the reference cells 70'-1 and 70'-2 to NB[3] of the reference cell 70'-3 to triple the pulldown capability, if BLin[1], BLin[2], and BLin[3] are set to high. BLin[1], BLin[2], or BLin[3] can be optionally set to high or low to adjust the pulldown strength so that the turn-on time of RBL can be adjusted accordingly. BLin[1], BLin[2], or BLin[3] can also be controlled by setting three register bits. In another embodiment, the invert 71' can be omitted from schematic/layout database or disabled by removing contact(s) or via(s).

FIG. 6(*d*) shows a schematic of a reference cell triple 80", corresponding to the reference cell 103 in FIG. 5(*a*), reference cell 103' in FIG. 5(*b*), or reference cells 63-1 through 63-3 in FIG. 6(*a*), according to yet another embodiment. The reference cell triple 80" has three reference cells 70"-1, 70"-2, and 70"-3. Each reference cell has two inverters 71" and 72" modified from a cross-coupled latch in an SRAM cell. The inverter 72" has an input node coupled to a BLin and an output node NB coupled to a source of an NMOS 74" and whose drain is coupled to a RBL. An NMOS 73" can be coupled between the input of the inverter 72" and the BLin, used as a dummy transistor with the source or drain floating, or simply omitted from the schematic or layout. The gates of the NMOS 73" and 74" are coupled to a reference wordline (RWL) or wordline (WL). The reference cells 70"-1, 70"-2, and 70"-3 also have another inverter 71" modified from normal cell that has an input coupled to BLin and an output coupled to NB to double the pulldown capability. The reference cells 70"-1, 70"-2, and 70"-3 can be modified from normal cells by coupling the NB[1] and NB[2] of the reference cells 70"-1 and 70"-2 to NB[3] of the reference cell 70"-3 to triple the pulldown capability, if BLin[1], BLin[2], and BLin[3] are set to high. BLin[1], BLin[2], or BLin[3] can be optionally set to high or low to adjust the pulldown strength so that the turn-on time of RBL can be adjusted accordingly. BLin[1], BLin[2], or BLin[3] can also be controlled by setting a plurality of register bits.

FIGS. 6(*a*), 6(*b*), 6(*c*), and 6(*d*) only show a few of many possible embodiments of reference cells. For example, the NMOS 73' in FIG. 6(*c*) or NMOS 73" in FIG. 6(*d*) can be removed from the schematic/layout database or disabled by omitting a single or plurality of contact or via. Similarly, the inverter 71' in FIG. 6(*c*) can be removed from the schematic/layout database or disabled by omitting a single or plurality of contact or via. The number of reference cells in a wordline or reference wordline may vary. The number of normal/reference rows or columns may vary too. It is desirable to place the reference cell near the far end of a wordline or reference wordline driver so that the selected reference cell can be turned on later than any selected normal cells. In general, it is more desirable to keep the transistors in the reference cells intact as the normal cells, but omitting some contact(s)/via(s) or using metal 1 or metal 2 for re-wiring. The more the reference cell resembles to the normal cell, the better the tracking capability. The above discussions are for illustrative purposes. There are many variations and equivalent embodiments of building reference cells, and that are all within the scope of this invention for those skilled in the art.

Figure 1:
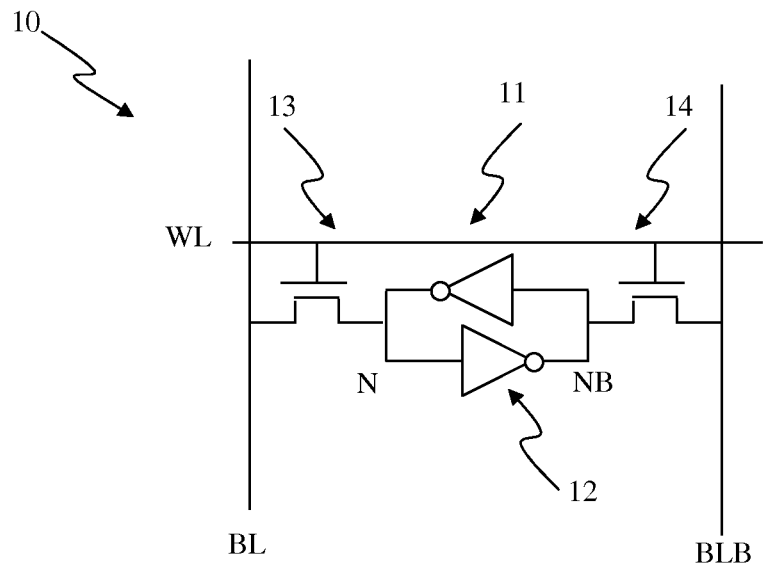
FIG. 1 shows an SRAM cell commonly used in an SRAM memory.
Figure 2:
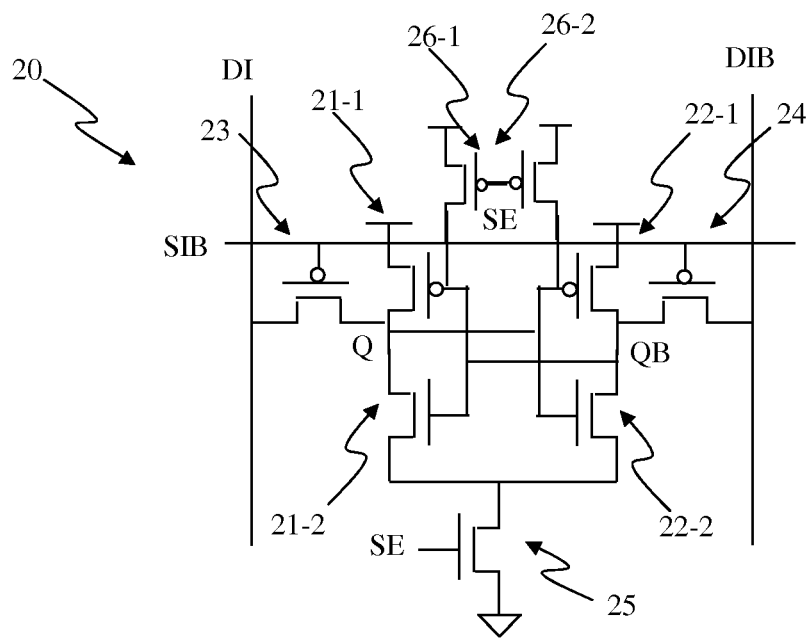
FIG. 2 shows a sense amplifier commonly used in an SRAM memory.
Figure 3A:
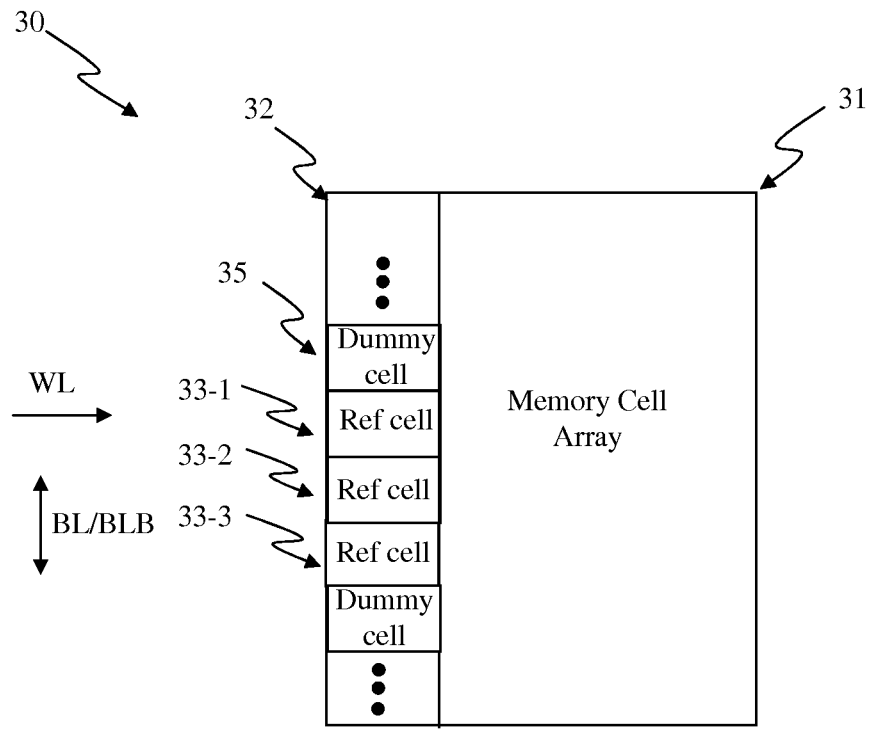
FIG. 3(a) shows a portion of a conventional block diagram of a self-timed circuit.
Figure 3B:
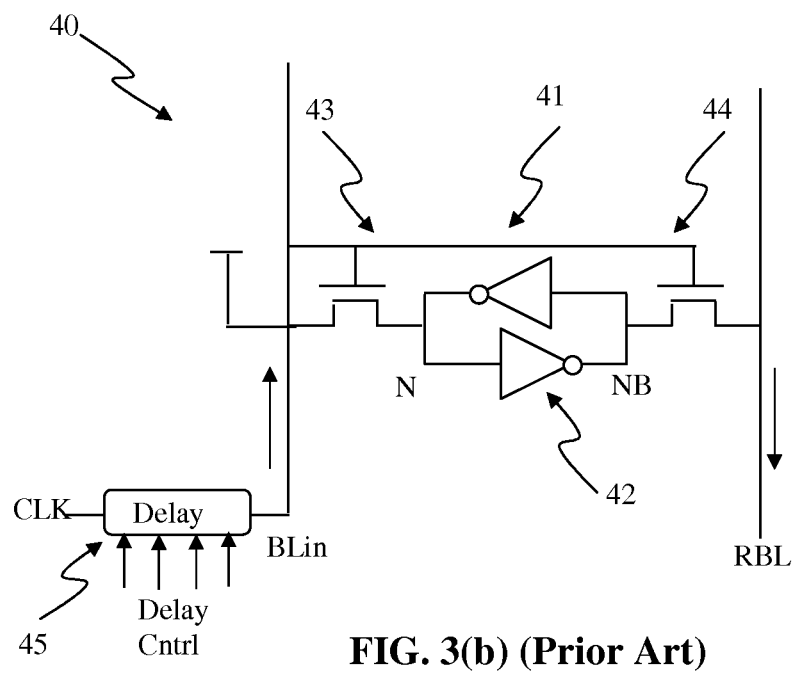
FIG. 3(b) shows a schematic of a conventional reference cell.
Figure 4A:
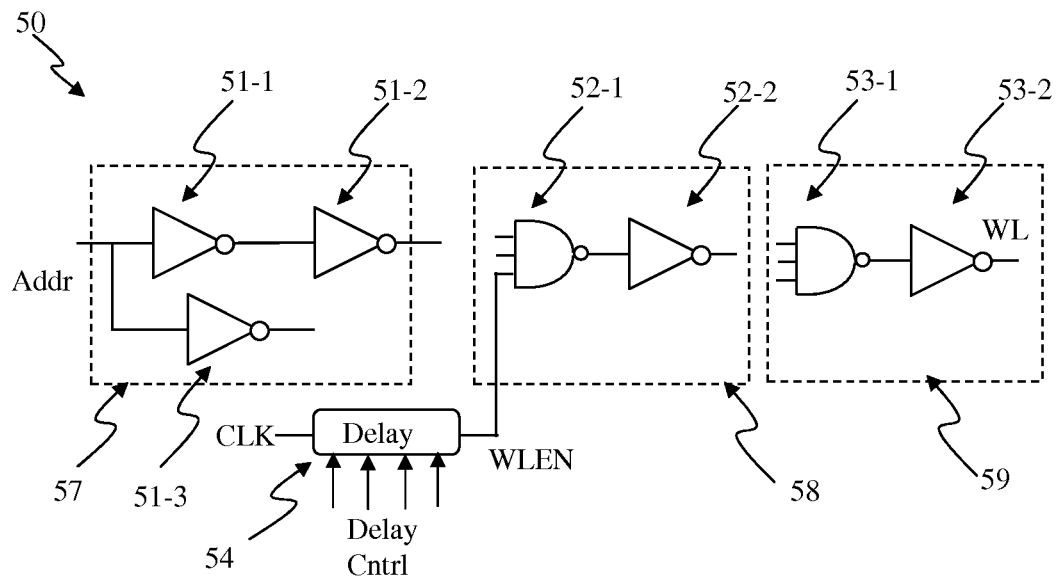
FIG. 4(a) shows a schematic of a wordline enable (WLEN) control circuit.
Figure 4B:
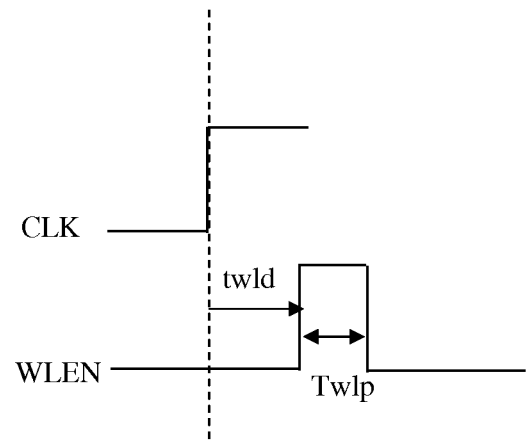
FIG. 4(b) shows a timing diagram of the WLEN with respect to a control signal CLK.
Figure 7:
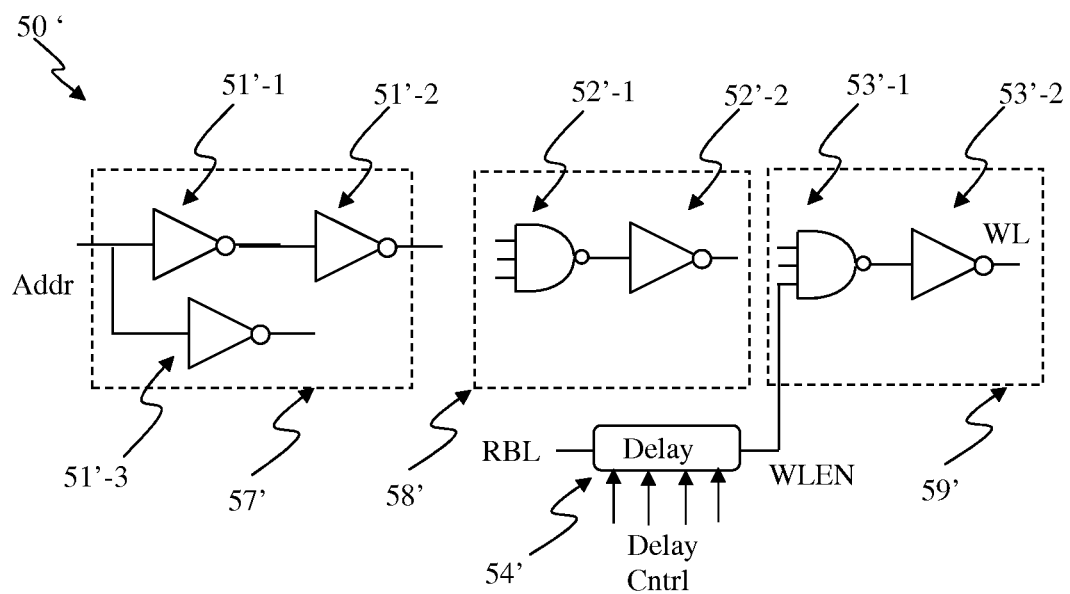
FIG. 7 shows a portion of a schematic of address buffer, pre-decoder, and decoder with WLEN according to one embodiment.

FIG. 7 shows a block diagram 50' of a portion of address buffers, pre-decoders, and decoders according to one embodiment. The schematic 50' has a plurality of address buffers 57', pre-decoders 58', and decoders 59'. The address buffer 57' consists of inverters 51'-1, 51'-2 and 51'-3 to generate true and complement addresses, respectively. The pre-decoder 58' has a multi-input NAND 52'-1 and followed by a buffer 52'-2. The decoder 59' has a multi-input NAND 53'-1 and followed by a wordline driver 53'-2 to drive a wordline. There are plural of address buffers coupled to plural of pre-decoders, and then the pre-decoders are further coupled to plural of decoders to fully decode the entire address space to generate a plurality of wordlines. A wordline enable (WLEN) can be provided to one of the inputs in the decoder 59', or to a pre-decoder 58', to shorten the wordline on/off time delay. WLEN can be generated from the RBL through a multi-tap delay line 54'. The delay line 54' can be controlled by a plurality of control signals or a plurality of registers. This scheme can improve the wordline turn off time much more precisely than in the prior art as shown in FIG. 4.

Figure 8:
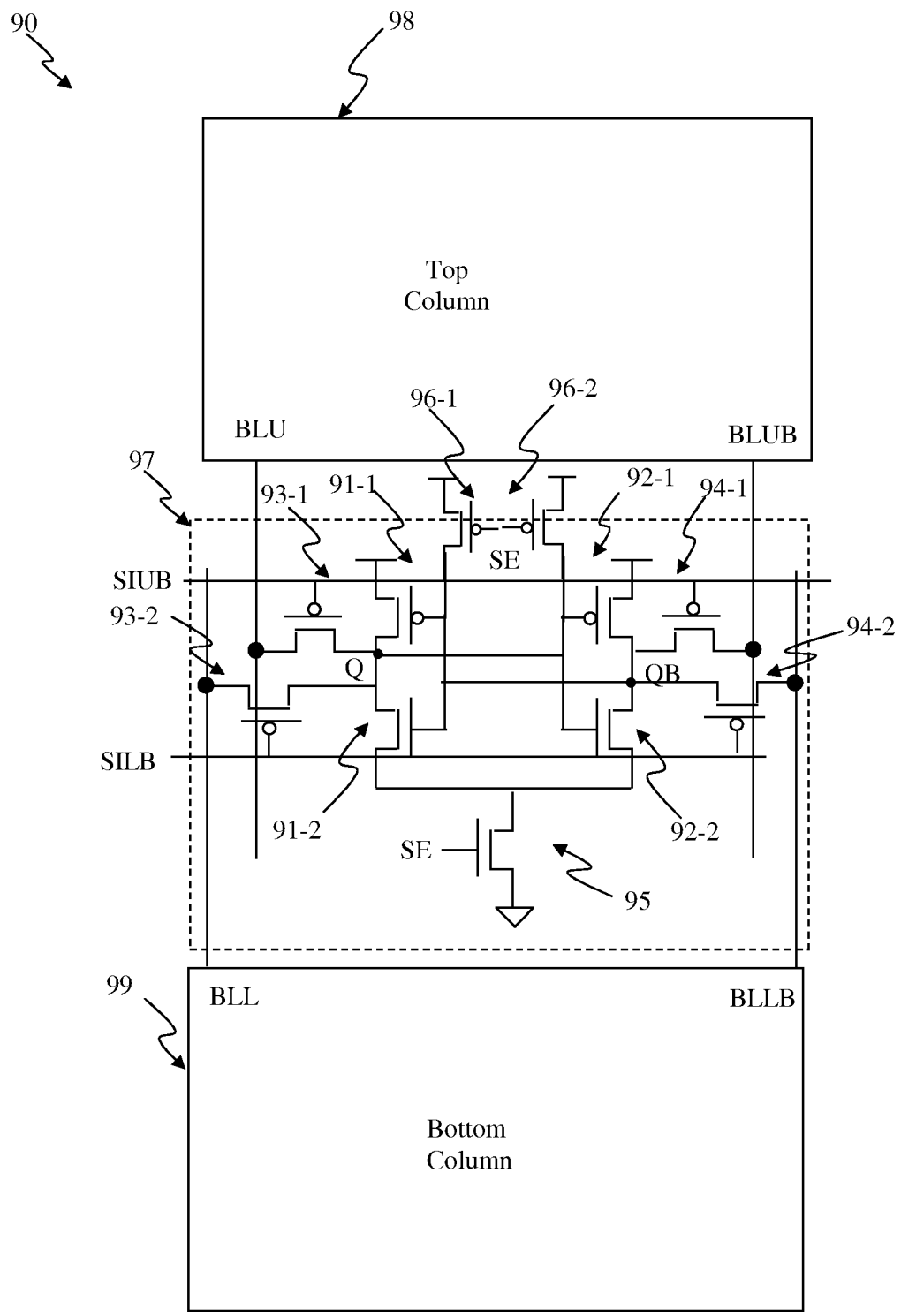
FIG. 8 shows a portion of a schematic of a sense amplifier shared between upper and lower columns.

FIG. 8 shows a block diagram of a portion of an SA schematic 90 with an input multiplexer according to one embodiment. The block diagram 90 has two columns, top column 98 and bottom column 99, and an SA 97. The SA 97 has a PMOS 91-1 and an NMOS 91-2 constructed as an inverter with input QB and output Q, but the source of NMOS 91-2 is coupled to ground through an NMOS 95. The SA 97 also has a PMOS 92-1 and an NMOS 92-2 constructed as an inverter with input Q and output Oft but the source of NMOS 92-2 is coupled to ground through the same NMOS 95. The gate of NMOS 95 is coupled to an SA enable (SE). Nodes Q and QB are coupled to BLU and BLUB through PMOS 93-1 and 94-1, respectively. The gates of PMOS 93-1 and 94-1 are coupled to a sense amplifier upper input enable bar (SIUB). Nodes Q and QB are also coupled to BLL and BLLB through PMOS 93-2 and 94-2, respectively. The gates of PMOS 93-2 and 94-2 are coupled to a sense amplifier lower input enable bar (SILB). The BLU and BLUB are the bitline and bitline bar of the upper column. Similarly, the BLL and BLLB are the bitline and bitline bar of the lower column. The upper and lower column 98 and 99 can share the same SA with two different input selects SIUB and SILB to select the upper BLs or the lower BLs, respectively.

Figure 9:
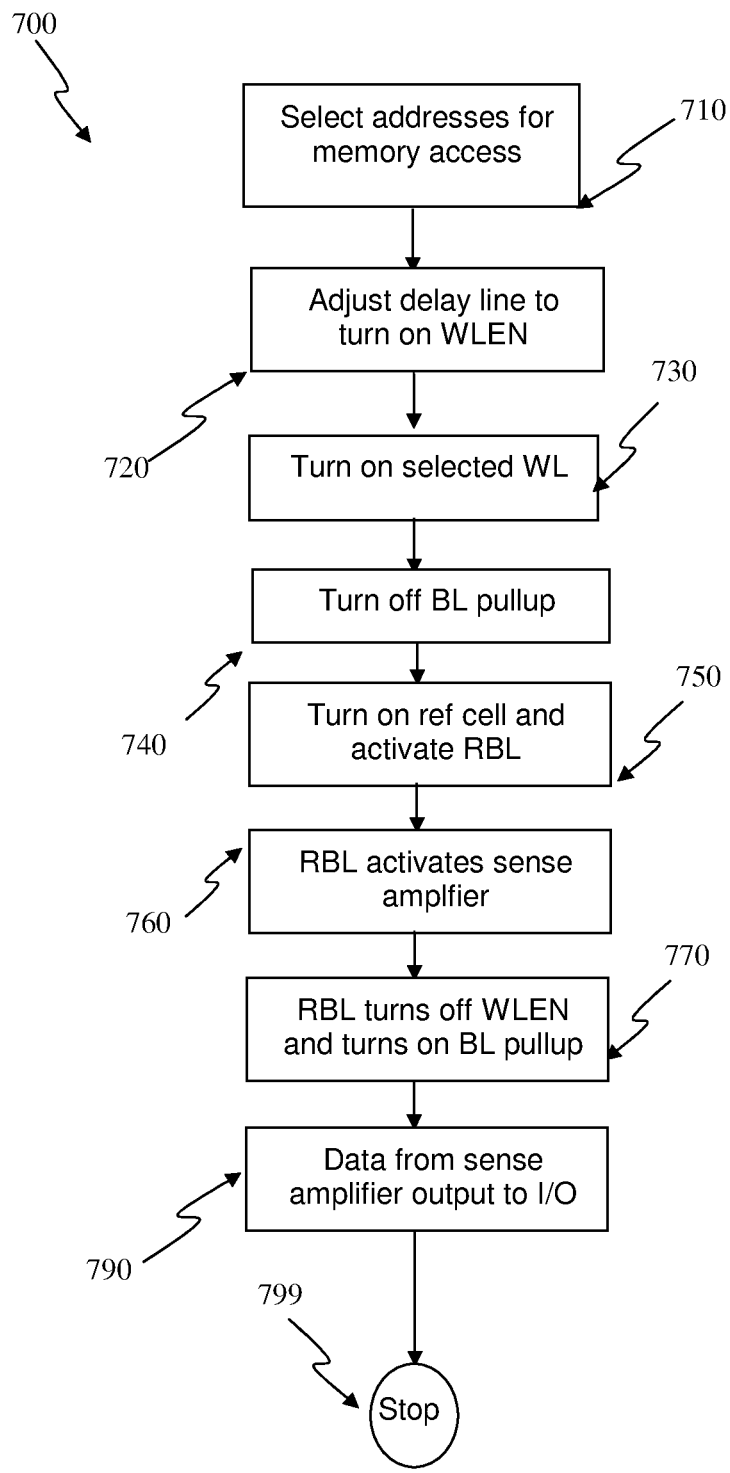
FIG. 9 depicts a method in a flow chart to read an SRAM cell in self-timed according to one embodiment.

FIG. 9 shows a flow chart 700 depicting a method to self-timed read accesses, according to one embodiment. The procedure starts at 710 to select addresses for memory access. Normally, the addresses are latched in flip-flops or latches and triggered by a clock transition for a new memory access. A wordline Enable (WLEN) can be generated from a clock CLK with a proper delay line in step 720. Subsequently a wordline (WL) can be selected when the addresses and WLEN go through the address buffers, pre-decoders, and decoders to a wordline driver in step 730. Then the bitline pull-ups can be turned off in step 740 to save power and to speed up BL/BLB pulldown. At least one reference cell can be turned on to activate RBL when a wordline and/or a reference wordline is turned on in step 750. The RBL can be used to trigger at least one SA after proper buffering in step 760. After SA is activated, the WLEN and BL pullup can be de-asserted by using RBL after proper buffering in step 770. Finally, the data from SA outputs can be sent to I/Os after some buffering. Then, the read access is completed and the procedure stops in step 799. Similar procedure can be applied to self-timed write.

The method 700 is described in the context a self-timed SRAM, such as the SRAM memory 100 in FIG. 5(a) or 100' in FIG. 5(b). In addition, although described as a flow of steps, one of ordinary skill in the art will recognize that at least some of the steps may be performed in a different order, including simultaneously, or skipped.

Figure 10:
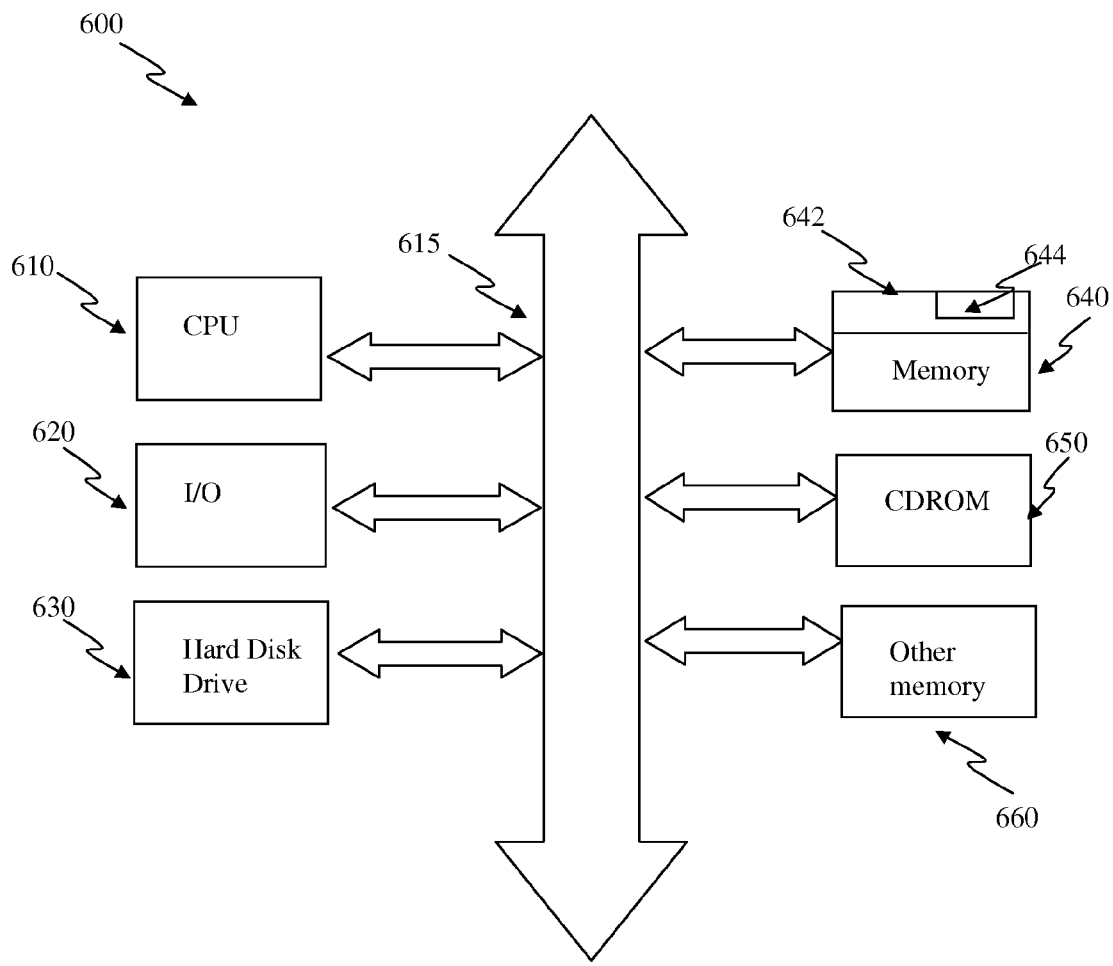
FIG. 10 shows a processor system using at least one self-timed SRAM memory according to one embodiment.

FIG. 10 shows a processor system 600 according to one embodiment. The processor system 600 can include an SRAM cell or reference cell 644, such as in a cell array 642, in a self-timed SRAM memory 640, according to one embodiment. The processor system 600 can, for example, pertain to an electronic system. The electronic system can include a Central Process Unit (CPU) 610, which communicate through a common bus 615 to various memory and peripheral devices such as I/O 620, hard disk drive 630, CDROM 650, self-timed SRAM memory 640, and other memory 660. Other memory 660 is a conventional memory such as conventional SRAM, DRAM, or flash, typically interfaces to CPU 610 through a memory controller. CPU 610 generally is a microcontroller, microprocessor, a digital signal processor, or other programmable digital logic devices. Self-timed SRAM Memory 640 is preferably constructed as an SRAM cell or reference cell device 644. The memory 640 typically interfaces to CPU 610 through a bus interface unit. If desired, the memory 640 may be combined with the processor, for example CPU 610, in a single integrated circuit.

The invention can be implemented in a part or all of an integrated circuit in a Printed Circuit Board (PCB), in a system, or as a method. The above description and drawings are only to be considered illustrative of exemplary embodiments, which achieve the features and advantages of the present invention. Modifications and substitutions of specific process conditions and structures can be made without departing from the spirit and scope of the present invention.

The many features and advantages of the present invention are apparent from the written description and, thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:
1. A SRAM memory, comprising:
   a plurality of SRAM cells having a bitlines (BL) and wordline (WL) that can be selected for access;
   at least one reference cell having a reference bitline in (BLin) and a reference bitline (RBL) that can be selected from one of a plurality of wordlines or from at least one reference wordline, the reference cell being selectable not earlier than any selected SRAM cells and the RBL being activatable not later than any selected SRAM cells to activate the selected BL;
   at least one sense amplifier to sense signals coupled to the selected BL from the at least one selected SRAM cell and convert the signals into digital data; and
   wherein the sense amplifier can be activated by the RBL signal to track the wordline and BL propagating delay,
   wherein the reference cell has at least one logic gate with an input coupled to BLin and an output NB coupled to RBL, and
   wherein the RBL is activated by setting BLin at a voltage near a supply voltage or ground once the wordline or reference wordline is selected.
2. A SRAM memory as recited in claim 1, wherein the at least one reference cell is placed near the far end of a driver to drive a selected wordline or a reference wordline.
3. A SRAM memory as recited in claim 1, wherein the logic gate comprises an inverter.

4. A SRAM memory as recited in claim 3, wherein the inverter in a reference cell have substantially the same device size, shape, and layout style of an inverter in an SRAM cell.

5. A SRAM memory as recited in claim 3, wherein the output nodes NB of a plurality of reference cells in the same selected wordline or reference wordline are coupled together.

6. A SRAM memory as recited in claim 3, wherein the BLin of the reference cells of the same selected wordline or reference wordline are coupled to a plurality of registers, whose contents can be loaded with data.

7. A SRAM memory as recited in claim 1, wherein the turn-off of the selected wordline or reference wordline is controlled by the activation of the RBL.

8. A SRAM memory as recited in claim 7, wherein the wordline or reference wordline is generated from at least one pre-decoder and decoder, which can be turned off by the activation of the RBL to at least one of the pre-decoder and/or decoder.

9. An electronics system, comprising:
a processor; and
an SRAM memory operatively connected to the processor, the SRAM memory comprising:
    a plurality of SRAM cells having at least a bitline (BL) and a wordline that can be selected for access;
    at least one reference cell having a reference bitline in (BLin) and a reference bitline (RBL) that can be selected from one of a plurality of wordlines or from a reference wordline, where the reference cell can be selected not earlier than any selected SRAM cells and can activate RBL not later than any selected SRAM cell to activate the selected BL; and
    at least one sense amplifier to sense signals coupled from the selected BL from the at least one selected SRAM cell and convert the signals into digital data,
wherein the sense amplifier can be triggered by the RBL signal to track the wordline and BL propagating delay,
wherein the reference cell has at least one logic gate with an input coupled to BLin and an output NB coupled to RBL, and
wherein the RBL is activated by setting BLin at a voltage near a supply voltage or ground once the wordline or reference wordline is selected.

10. A SRAM memory as recited in claim 9, wherein the at least one reference cell is placed near the far end of a driver to drive a selected wordline or a reference wordline.

11. A SRAM memory as recited in claim 9, wherein the logic gate comprises an inverter.

12. A SRAM memory as recited in claim 11, wherein the logic gate in a reference cell has substantially the same device size, shape, and layout style of a logic gate in an SRAM cell.

13. A SRAM memory as recited in claim 11, wherein the output nodes NB of a plurality of reference cells in the same selected wordline or reference wordline are coupled together.

14. A SRAM memory as recited in claim 11, wherein the BLin of the reference cells of the same selected wordline or reference wordline are coupled to a plurality of registers, whose contents can be loaded with data.

15. A SRAM memory as recited in claim 11, wherein the turn-off of the selected wordline or reference wordline is controlled by the activation of the RBL.

16. A SRAM memory as recited in claim 11, wherein the selected wordline or reference wordline is generated from at least one pre-decoder and decoder, which can be turned off by the activation of the RBL to at least one of the pre-decoder and/or decoder.

17. A method for providing a self-timed SRAM memory, comprising:
    (i) providing a plurality of SRAM cells having at least a bitline (BL) and a wordline that can be selected for access, (ii) at least one reference cell having a bitline in (BLin) and a reference bitline (RBL) that can be selected from a wordline or a reference wordline; (iii) at least one sense amplifier to sense signals from the selected BL from the at least one selected SRAM cell and convert the signals into digital data; and (iv) the reference cell can be selected not earlier than any selected SRAM cells and can activate RBL not later than any selected SRAM cells to activate the selected BL,
wherein the sense amplifier is triggered by the activation of RBL to track the wordline and BL propagation delay,
wherein the reference cell has at least one logic gate with an input coupled to BLin and an output NB coupled to RBL, and
wherein the RBL is activated by setting BLin at a voltage near a supply voltage or ground once the wordline or reference wordline is selected.

18. A method for providing a self-timed SRAM memory as recited in claim 17, wherein the RBL is activated by setting BLin at the voltage near the supply voltage once the wordline or reference wordline is selected.

19. A method for providing a self-timed SRAM memory as recited in claim 18, wherein the at least one logic gate comprises an inverter and/or a reference pass transistor in a reference cell have substantially the same device size, shape, and layout style of at least one logic gate and/or a cell pass transistor in an SRAM cell.

20. A method for providing a self-timed SRAM memory as recited in claim 17, wherein the turn-off of the selected wordline or reference wordline is controlled by the activation of the RBL.

* * * * *